US011271556B2

(12) United States Patent
Adut et al.

(10) Patent No.: US 11,271,556 B2
(45) Date of Patent: Mar. 8, 2022

(54) MODULAR ANALOG SIGNAL MULTIPLEXERS FOR DIFFERENTIAL SIGNALS

(71) Applicant: Analog Devices International Unlimited Company, Limerick (IE)

(72) Inventors: Joseph Adut, Palo Alto, CA (US); Gregory Fung, Fremont, CA (US); Brian Hamilton, Menlo Park, CA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/923,884

(22) Filed: Jul. 8, 2020

(65) Prior Publication Data

US 2021/0091761 A1    Mar. 25, 2021

Related U.S. Application Data

(60) Provisional application No. 62/902,945, filed on Sep. 19, 2019.

(51) Int. Cl.
*H03K 17/00* (2006.01)
*H03M 1/12* (2006.01)
(52) U.S. Cl.
CPC ........ *H03K 17/005* (2013.01); *H03M 1/1205* (2013.01)
(58) Field of Classification Search
CPC ............................ H03K 17/005; H03M 1/1205
See application file for complete search history.

(56) References Cited

U.S. PATENT DOCUMENTS

| 5,926,068 A * | 7/1999 | Harr ................... H03F 3/45103 |
| | | 327/359 |
| 6,385,214 B1 | 5/2002 | Kikuchi et al. | |
| 6,518,906 B2 * | 2/2003 | Abel ............... H03K 17/04106 |
| | | 326/115 |

(Continued)

OTHER PUBLICATIONS

*LB-11 The LM110—An Improved IC Voltage Follower*, Texas Instruments, Literature No. SNOA684, Mar. 1970, 6 pages.

(Continued)

*Primary Examiner* — Lincoln D Donovan
*Assistant Examiner* — Colleen J O Toole
(74) *Attorney, Agent, or Firm* — Patent Capital Group

(57) ABSTRACT

An example analog signal multiplexer includes two differential input signal ports for receiving a first and a second differential input signals, IN1 and IN2. The multiplexer further includes a differential output signal port with two output terminals OUT+ and OUT−, for outputting a signal based on one or more of the input signals IN1 and IN2. Furthermore, the multiplexer includes a pair of load elements, and an additional differential output signal port that has two output terminals TERM+ and TERM−. The load elements are not coupled directly to the output terminals OUT+ and OUT−, but, rather, are coupled to the output terminals of the additional output signal port, TERM+ and TERM−, enabling a modular approach where multiple instances of the multiplexer may be combined on an "as-needed" basis to realize multiplexing between a larger number of differential inputs that a single multiplexer would allow.

26 Claims, 19 Drawing Sheets

(56) References Cited

U.S. PATENT DOCUMENTS

| | | | |
|---|---|---|---|
| 7,199,619 B2* | 4/2007 | Tam | H03K 3/35613 |
| | | | 326/105 |
| 7,816,990 B2* | 10/2010 | Hijikata | H03G 3/3036 |
| | | | 330/279 |
| 7,969,558 B2 | 6/2011 | Hall | |
| 8,063,696 B2* | 11/2011 | Shinmyo | H04L 25/0272 |
| | | | 327/563 |
| 9,299,731 B1 | 3/2016 | Lenius et al. | |
| 2018/0275250 A1 | 9/2018 | Adut | |
| 2018/0284272 A1 | 10/2018 | Adut | |

OTHER PUBLICATIONS

Super-Gain Transistors for IC's, Manuscript received Jan. 9, 2969; revised Mar. 13, 1969, 3 pages.

* cited by examiner

MODULAR ANALOG SIGNAL MULTIPLEXERS FOR DIFFERENTIAL SIGNALS

CROSS REFERENCE TO RELATED APPLICATIONS

This application claims the benefit of and priority from U.S. Patent Application No. 62/902,945, filed Sep. 19, 2019, titled "MODULAR ANALOG SIGNAL MULTIPLEXERS FOR DIFFERENTIAL SIGNALS," the disclosure of which is hereby incorporated by reference herein in its entirety.

TECHNICAL FIELD OF THE DISCLOSURE

The present disclosure relates generally to electronics and, more specifically, to multiplexer circuits for differential analog signals.

BACKGROUND

Light detection and ranging (LIDAR) refers to a surveying method that measures distance to a target object by illuminating the object with light (e.g., with pulses of light, e.g., pulses of laser light) and measuring the reflected light with an optical sensor such as an Avalanche Photo Diode (APD). Differences in pulse return times or wavelengths can then be used to determine the distance to the object and/or make digital three-dimensional representations of the object. LIDAR systems are used in a variety of situations. For example, LIDAR systems can be used with airplanes, automobiles, binoculars or monoculars, etc.

A conventional receiver chain of a LIDAR system may include a sequence of an optical sensor that receives/detects optical pulses and converts them to electrical current, a transimpedance amplifier (TIA) that converts current signals from the optical sensor into voltage signals, and an analog-to-digital converter (ADC) that converts the voltage signals from the TIA to digital signals for further processing.

High-definition LIDAR systems, e.g., those deployed in vehicles with Advanced Driver Assistance Systems (ADAS), employ multiple lasers for emitting light pulses and multiple optical sensors for receiving light pulses reflected from objects. In order to reduce board area, power dissipation, and bill of materials of LIDAR receivers of such systems, it would be desirable to build a multi-channel system where, e.g., output signals from different TIAs may be multiplexed together to use a single ADC (instead of each TIA using an individual ADC). Unfortunately, conventional commercial-off-the-shelf (COTS) TIAs used in state-of-the-art LIDAR systems do not help LIDAR system engineers to build a multi-channel system easily. One drawback of conventional COTS TIAs is that, to assemble an economic system, additional analog switches and gain blocks need to be placed in the signal path that often compromise the receiver's bandwidth and dynamic range. Another drawback is that conventional COTS TIAs are not modular in that they do not allow multiplexing any desired number of TIA outputs to a single ADC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

Some aspects of the present disclosure relate to analog signal multiplexer circuits (or, simply, "analog signal multiplexers") that may be used to multiplex different analog signals. As used herein, the term "multiplexing" signals is used in its conventional sense in that it refers to receiving a certain plurality of signals as input signals, and providing at an output a certain smaller number of output signals, where the output signals are in some way indicative of one or more of the input signals. Circuits that perform multiplexing of signals are referred to as "multiplexer circuits" or, simply, "multiplexers." When such circuits operate on analog signals, they may be referred to as "analog signal multiplexers."

Figure 4A:
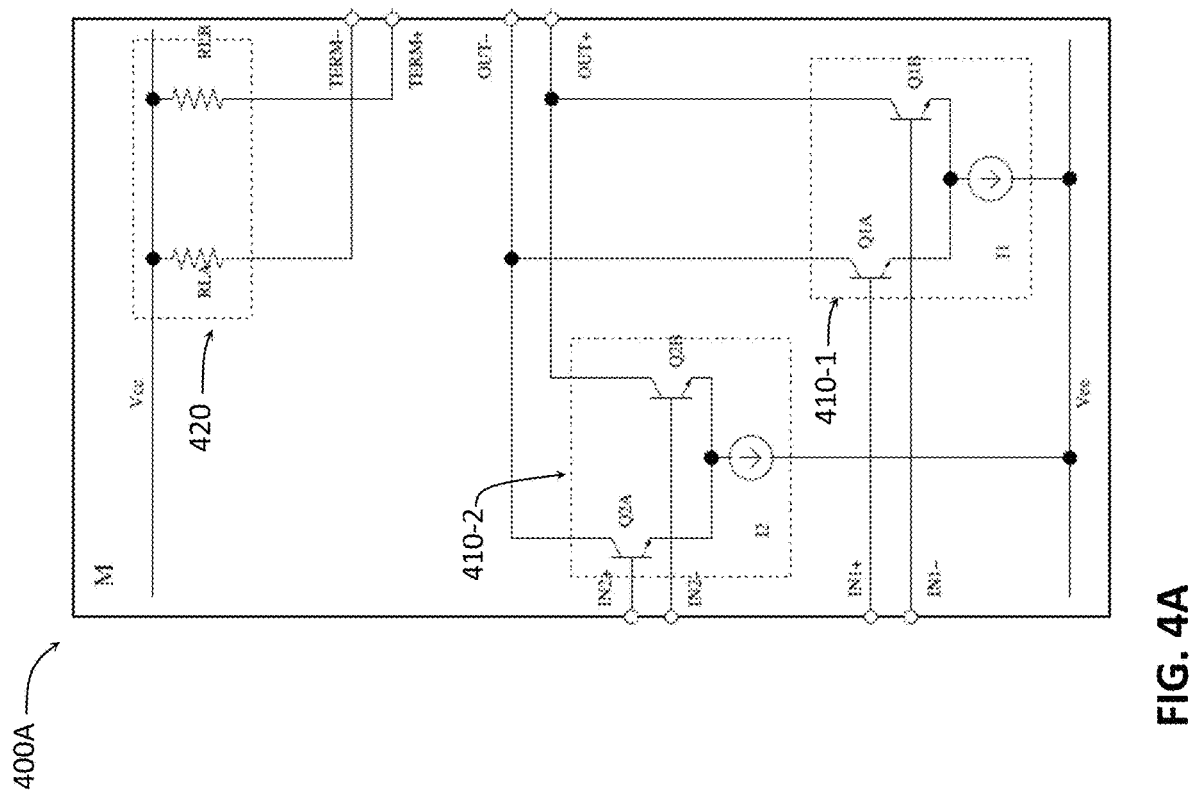
FIGS. 4A-4B are electric circuit diagrams showing a modular analog signal multiplexer with two channels according to various embodiments of the present disclosure.

A signal may be single-ended or differential. Because analog signal multiplexers described herein may be particularly advantageous for sharing a single ADC between multiple TIAs of a LIDAR receiver and because some ADCs operate better when the input signals provided to them are differential signals, analog signal multiplexers described herein are analog signal multiplexers for differential signals. Therefore, each input signal and each output signal of the analog signal multiplexers described herein is a differential signal. A signal port for a differential input signal has two input terminals: a non-inverting input terminal (denoted herein as "IN+") and an inverting input terminal (denoted herein as "IN−"). Similarly, a signal port for a differential output signal has two output terminals: a non-inverting output terminal (denoted herein as "OUT+") and an inverting output terminal (denoted herein as "OUT−"). However, while differential signals are described herein with reference to the input and output signals of the multiplexers, in some embodiments, at least some of the input and/or the output signals of the multiplexers themselves may be single-ended, with a single-ended to differential converter stage coupled to any of the inputs of the multiplexers to convert the single-ended input signals to differential input signals and/or with a differential to single-ended converter stage coupled to any of the outputs of the multiplexers to convert the differential output signals to single-ended output signals. For example, while FIG. 4A illustrates each of the inputs IN1 and IN2 being a differential input, the analog signal multiplexer of this drawing includes embodiments where the differential inputs IN1 and IN2 are inputs to the output stages 410-1 and 410-2, respectively, but the multiplexer 400A may have single-ended inputs for the input signals IN1 and IN2, which are then converted to differential inputs provided to the output stages 410-1 and 410-2.

In some embodiments, an example analog signal multiplexer described herein may include two differential input signal ports, where the first input signal port has two input terminals IN1+ and IN1− for receiving the first differential input signal IN1 (e.g., the signal IN1 may be indicative of an output from one TIA), and the second input signal port has two input terminals IN2+ and IN2− for receiving the second differential input signal IN2 (e.g., the signal IN2 may be indicative of an output from another TIA). Such a multiplexer may include one differential output signal port that has two output terminals OUT+ and OUT− for outputting a multiplexed signal based on one or more of the two input signals IN1 and IN2. In addition, such a multiplexer may include a pair of load elements, e.g., a pair of load resistors (denoted herein as resistors "RLA" and "RLB"), and an additional differential output signal port that has two output terminals denoted herein as "TERM+" and "TERM−". The load elements are not coupled directly to the output terminals OUT+ and OUT−, but, rather, are coupled to the output terminals of the additional output signal port, TERM+ and TERM−, which may later be coupled to the output terminals OUT+ and OUT−. In other embodiments, an example analog signal multiplexer may include a switch arrangement that includes one or more switches, configured to either couple (i.e., electrically connect) or de-couple (i.e., electrically disconnect) the load elements to the output terminals OUT+ and OUT−. Such configurations enable a modular approach where multiple instances of such an analog signal multiplexer may be combined on an "as-needed" basis to realize multiplexing between a larger number of differential inputs that a single analog signal multiplexer would allow. Therefore, such analog signal multiplexers may advantageously provide modular, extendable output stages that can be easily configured to facilitate construction of multi-channel LIDAR receivers where multiple output stages may be combined with only a minimal number of additional components required for the combination.

An "output stage" may refer to a circuit configured to condition a signal in some manner before providing it as an input signal to a further electronic component. Any of the analog signal multiplexers described herein may be referred to as "output stage" because they condition signals in some manner. However, some components of the analog signal multiplexers described herein, e.g., differential pairs or differential current mirrors, may also be referred to as "output stages."

In some embodiments, any of the modular analog signal multiplexers described herein may be used as, or in, one or more output stages of a plurality of TIAs (which TIAs may, e.g., be used in a LIDAR receiver of a LIDAR system) to enable the use of a single ADC to convert differential outputs from the plurality of TIAs. For example, any of the modular analog signal multiplexers described herein may be used to realize an output stage for a plurality of TIAs by receiving multiple differential input signals (i.e., by receiving differential inputs from the plurality of TIAs) and providing a reduced number of differential output signals (e.g., providing a single differential output signal) to a further electronic component such as an ADC. In some embodiments, one or more of such analog signal multiplexers may be used as an output stage for a plurality of TIAs, where each of the plurality of TIAs may be associated with a designated optical sensor (e.g., for a plurality of instances of a TIA 834 coupled to an optical sensor 832 shown in FIG. 8). In some such embodiments, such an output stage may be implemented between the outputs of the TIAs and a subsequent filter, such as a filter 836 shown in FIG. 8. In other words, the output stage may receive a plurality of inputs from the different instances of the TIA 834 and provide an output as an input to a single filter 836. In other such embodiments, such an output stage may be implemented between the outputs of the subsequent filters associated with each TIA (i.e., the outputs of the multiple instances of the filters 836 for multiple instances of optical sensor-TIA-filter link shown in FIG. 8) and a single ADC driver, such as the ADC driver 838 shown in FIG. 8. In other words, the output stage may receive a plurality of inputs from the different instances of the filter 836 and provide an output as an input to a single ADC driver 838. An ADC driver may implement functions such as buffering, amplitude scaling, single-ended-to-differential conversion, common-mode offset adjustment, and filtering.

Figure 8:
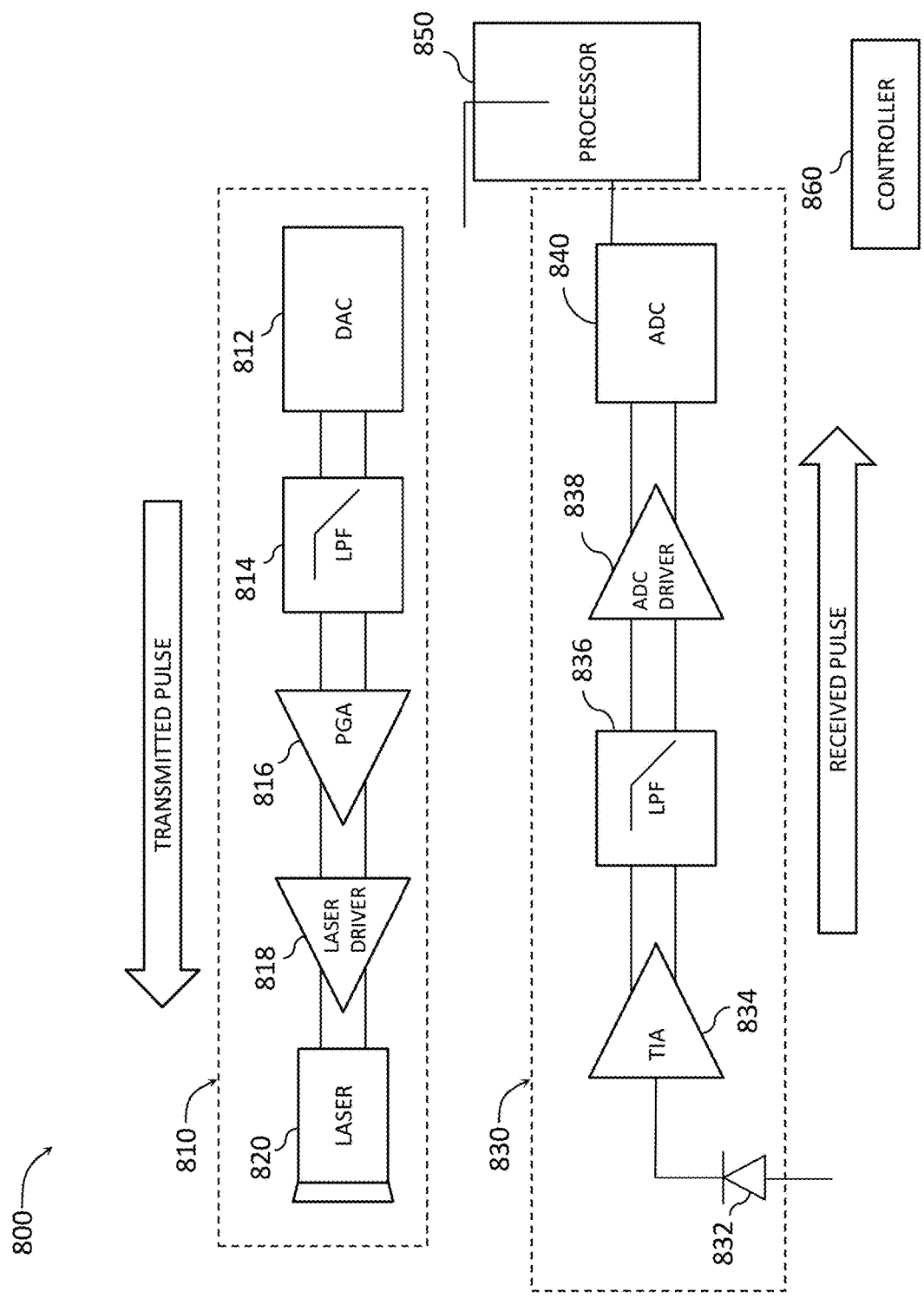
FIG. 8 is a schematic diagram of an example LIDAR system in which any of the modular analog signal multiplexers described herein may be implemented, according to some embodiments of the present disclosure.

In other embodiments, any of the modular analog signal multiplexers described herein may be used as an output stage for a plurality of ADC drivers, each of which is associated with a designated optical sensor and a designated TIA (e.g., for a plurality of instances of a TIA 834 coupled to an optical sensor 832 and an ADC driver 838 coupled to the TIA 834, shown in FIG. 8). In some such embodiments, such an output stage may be implemented between the outputs of the ADC drivers and a subsequent ADC, such as an ADC 840 shown in FIG. 8. In other words, the output stage may receive a plurality of inputs from the different instances of the ADC drivers 838 and provide an output as an input to a single ADC 840.

Even though some embodiments may refer to modular analog signal multiplexers that could be used as differential output stages of one or more TIAs, descriptions of these embodiments are equally applicable to embodiments where these analog signal multiplexers are used as stand-alone TIAs themselves, all of which embodiments being within the scope of the present disclosure.

Other aspects of the present disclosure provide systems, e.g., LIDAR systems (in particular, LIDAR receivers), that may include one or more modular analog signal multiplexers as described herein, as well as methods for operating such systems and methods for determining distance to at least one object using such systems. While some embodiments of the present disclosure refer to LIDAR as example systems in which modular analog signal multiplexers as described herein may be implemented, in other embodiments, modular analog signal multiplexers as described herein may be implemented in systems other than LIDAR where multiplexing of differential analog signal may be needed, all of which embodiments being within the scope of the present disclosure.

The exact design of modular analog signal multiplexers described herein may be realized in many different ways, all of which being within the scope of the present disclosure. In one example of design variations according to various embodiments of the present disclosure, a choice can be made, individually for each of the transistors of a modular analog signal multiplexer according to any of the embodiments described herein, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are sometimes described with reference to their first, second, and third terminals. The term "first terminal" of a transistor is used to refer to an emitter terminal if the transistor is a bipolar transistor or to a source terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to a base terminal if the transistor is a bipolar transistor or to a gate terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET). In another example, in various embodiments, a choice can be made, individually for each of the transistors of any of the modular analog signal multiplexers as described herein, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the modular analog signal multiplexers as described herein that are implemented as FETs may be planar transistors or may be non-planar transistors (some examples of the latter including FinFETs, nanowire transistors or nanoribbon transistors).

As will be appreciated by one skilled in the art, aspects of the present disclosure, in particular aspects of modular analog signal multiplexers as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g., to the existing receivers, LIDAR systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples. In the following description, reference is made to the drawings in which like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing.

In general, while some drawings provided herein illustrate various aspects of modular analog signal multiplexers for differential signals, and systems in which such circuits may be implemented, details of these systems may be different in different embodiments. For example, various components of modular analog signal multiplexers, presented herein, may have further components included therein, or coupled thereto, which are not specifically shown in the drawings, such as logic, storage, passive elements (e.g., resistors, capacitors, inductors, etc.), or other elements (e.g., transistors, etc.). In another example, details shown in some of the drawings, such as the particular arrangement and example implementation details of various components of modular analog signal multiplexers presented herein (e.g., load resistors RLA and RLB, differential pairs corresponding to different multiplexer inputs, etc.) and/or the particular arrangement of coupling connections (e.g., coupling connections between the differential terminals TERM+ and TERM− and the differential terminals OUT− and OUT+, coupling connections to ground and positive supply voltage, etc.) may be different in different embodiments, with the illustrations of the present drawings providing only some examples of how these components may be used together to realize modular analog signal multiplexers. In yet another example, although some embodiments shown in the present drawings illustrate a certain number of components (e.g., a certain number of differential inputs to any of the modular analog signal multiplexers illustrated in the drawings, a certain number of differential outputs from any of the modular analog signal multiplexers illustrated in the drawings, or a certain number of load resistors in any of the modular analog signal multiplexers illustrated in the drawings), it is understood that these embodiments may be implemented in a modular analog signal multiplexer or in any other devices or systems with any number of these components in accordance with the descriptions provided herein. Furthermore, although certain elements such as various elements of modular analog signal multiplexers described herein may be depicted in the drawings as communicatively coupled using a single depicted line, in some embodiments, any of these elements may be coupled by a plurality of conductive lines such as those that may be present in a bus, or when differential signals are involved.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a modular analog signal multiplexer circuit may be referred to simply as a "modular analog signal multiplexer," etc.). If used, the terms "substantially," "approximately," "about," etc., may be used to generally refer to being within +/−20% of a target value, e.g., within +/−10% of a target value, based on the context of a particular value as described herein or as known in the art.

Other features and advantages of the disclosure will be apparent from the following description and the select examples.

Example Use of Analog Signal Multiplexers and an Example of a Conventional Signal Multiplexer For purposes of illustrating modular analog signal multiplexers proposed herein, it might be useful to first understand settings in which analog signal multiplexing may be used, as well as phenomena that may come into play when analog signal multiplexing is performed. The following foundational information may be viewed as a basis from which the present disclosure may be properly explained. Such information is offered for purposes of explanation only and, accordingly, should not be construed in any way to limit the broad scope of the present disclosure and its potential applications.

Figure 1:
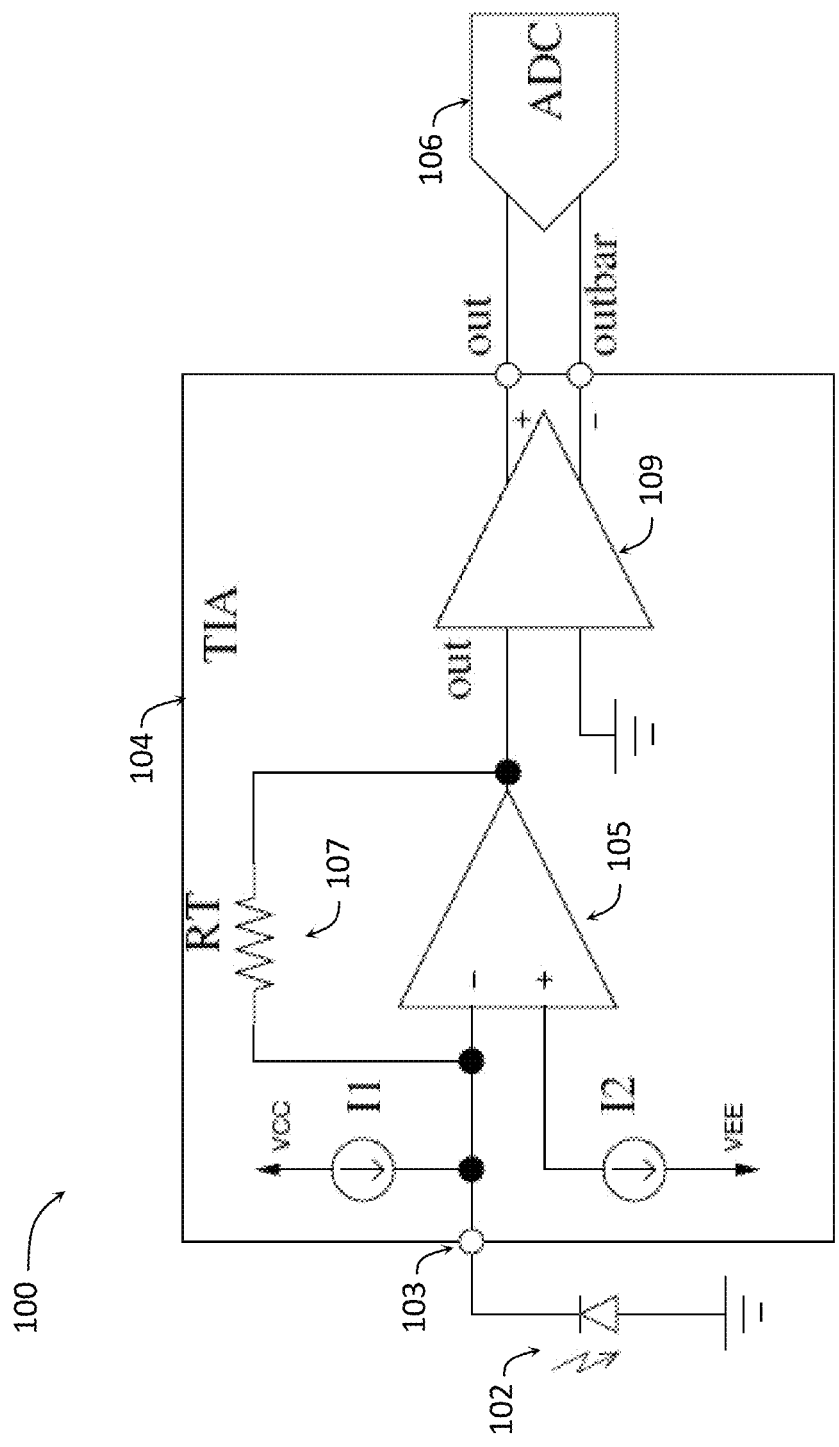
FIG. 1 is an electric circuit diagram showing a LIDAR receiver.

As described above, analog signal multiplexers may be used in LIDAR systems. FIG. 1 is a schematic diagram of a LIDAR receiver 100. A LIDAR receiver typically includes an optical sensor (for example, an APD) 102, a TIA 104, and an ADC 106. The optical sensor 102 may be configured to receive a pulse of light reflected from an object and to convert the pulse of light to a current pulse. As illustrated in FIG. 1, in some embodiments, the optical sensor 102 may have its cathode connected to the input port of the TIA 104 (the input port of the TIA 104 is illustrated in FIG. 1 with a white dot labeled with "103"). Accordingly, the optical sensor 102 may be negatively biased and can sink current from the TIA 104. Although not specifically shown in the present figures, in other embodiments, the optical sensor 102 may have its anode connected to the input port of the TIA 104; accordingly, the optical sensor 102 would then be positively biased and can source current to the TIA 104. Although FIG. 1 illustrates a current source I2, in other embodiments, the current source I2 may be replaced with a voltage source V2.

The TIA 104 may be configured to amplify the current pulse from the optical sensor 102 and provide a voltage pulse. In some embodiments, the TIA 104 may be a shunt-shunt feedback TIA, as shown in FIG. 1. Such a TIA may include an amplification circuit 105 and a feedback resistor (RT) 107 electrically coupled between an input of the amplification circuit 105 and an output of the amplification circuit 105. The output of the amplification circuit 105 may be electrically connected to an input of an ADC driver 109. The amplification circuit 105 may include one or more amplifiers. The ADC driver 109 may be configured to drive the ADC 106. For example, the ADC driver 109 may perform a single-to-differential conversion before providing the drive signal to the ADC 106 (possibly via one or more intermediate components, such as e.g., a filter). The ADC 106 may convert the received pulse to a digital signal. The digital signal can be provided to a digital signal processor (not shown in FIG. 1).

Figure 2:
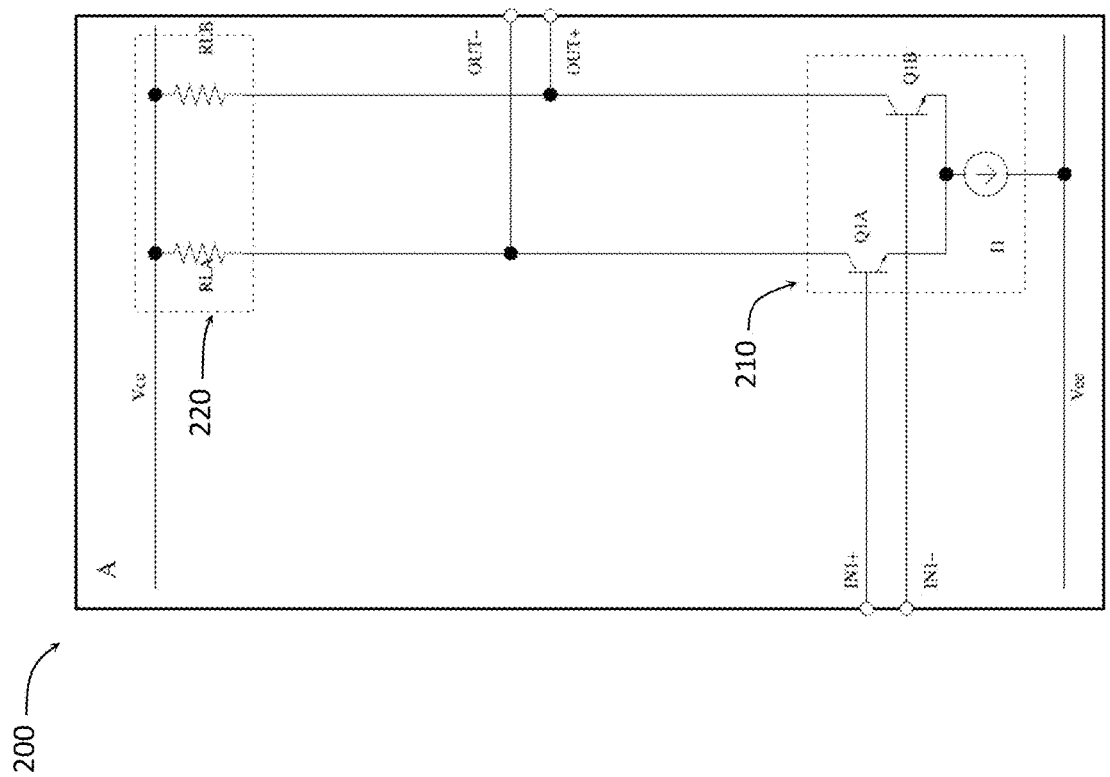
FIG. 2 is an electric circuit diagram showing a differential amplifier as an example of an output stage.

FIG. 2 shows a differential amplifier 200 as an example of an output stage. The differential amplifier 200 may, e.g., be an output stage for the TIA 104 shown in FIG. 1, where the outputs shown in FIG. 1 as out and outbar are provided to the differential amplifier 200 as, respectively, inputs IN1+ and IN1−. Thus, the differential amplifier 200 may include an input stage comprising a differential pair for receiving a differential input signal comprising IN1+ and IN1−. The differential amplifier 200 may include a differential pair 210 that includes a pair of emitter-coupled bipolar transistors Q1A and Q1B, IN1+ being received by the input stage at the base of Q1A and IN1− being received by the input stage at the base of Q1B. Emitter-coupled transistors Q1A and Q1B may be biased by a current source I1. The current source I1 can be turned off (or deactivated) to disable the differential pair of transistors Q1A and Q1B, or turned on (or activated) to enable the differential pair to produce differential output current at the collectors of Q1A and Q1B. The collector of Q1A may be connected to the terminal OUT− and coupled via the resistor RLA to the positive supply Vcc. The collector of Q1B may be connected to the terminal OUT+ and coupled via the resistor RLB to the positive supply Vcc. The resistors RLA and RLB may form a passive load 220. The differential output current from the differential pair may produce differential output signals when terminated to the passive load across the terminals OUT+ and OUT−.

Figure 3:
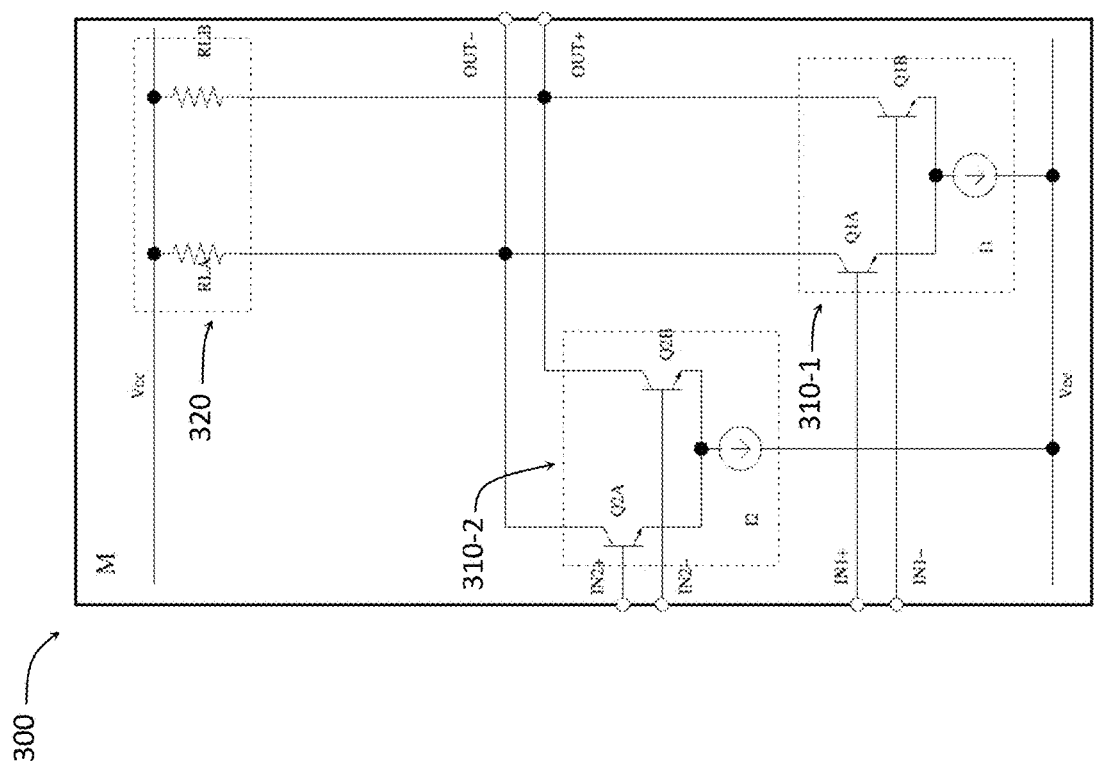
FIG. 3 is an electric circuit diagram showing a non-modular analog signal multiplexer with two channels.

FIG. 3 shows an analog signal multiplexer 300 (denoted as multiplexer "M") with two channels. Each channel may have a separate input signal path with the outputs of the channels combined in a common output signal path. For example, channel 1 may include terminals IN1+ and IN1− coupled to a differential pair 310-1 that may include emitter-coupled transistors Q1A and Q1B biased by a current source I1. Similarly, channel 2 may include terminals IN2+ and IN2− coupled to a differential pair 310-2 that may include emitter-coupled transistors Q2A and Q2B biased by a current source I2. Each of the differential pairs 310-1 and 310-2 may be a different instance of the differential pair 210 shown in FIG. 2. The multiplexer 300 may also include a passive load 320, similar to the load 220 described with referenced to FIG. 2. As shown in FIG. 3, the terminal OUT− may be connected to the collectors of Q1A and Q2A and to resistor RLA, while the terminal OUT+ may be connected to the collectors of Q1B and Q2B and to resistor RLB. Channel 1 or channel 2 can be coupled to the output of the multiplexer 300 by selective enabling of current sources I1 and I2. To select channel 1, I1 can be activated while I2 is turned off. To select channel 2, I2 can be activated while I1 is turned off. The multiplexer 300 can also be configured to sum channels 1 and 2 if both I1 and I2 are activated at the same time, or both channels can be isolated from the outputs by turning off I1 and I2 at the same time.

While the analog signal multiplexer 300 may provide means of combining multiple channels to a common output, it is not modular. Multiple instances of the analog signal multiplexer 300 cannot be combined at the outputs without degrading the output impedance by the number of instances.

Modular Analog Signal Multiplexers

Figure 4B:
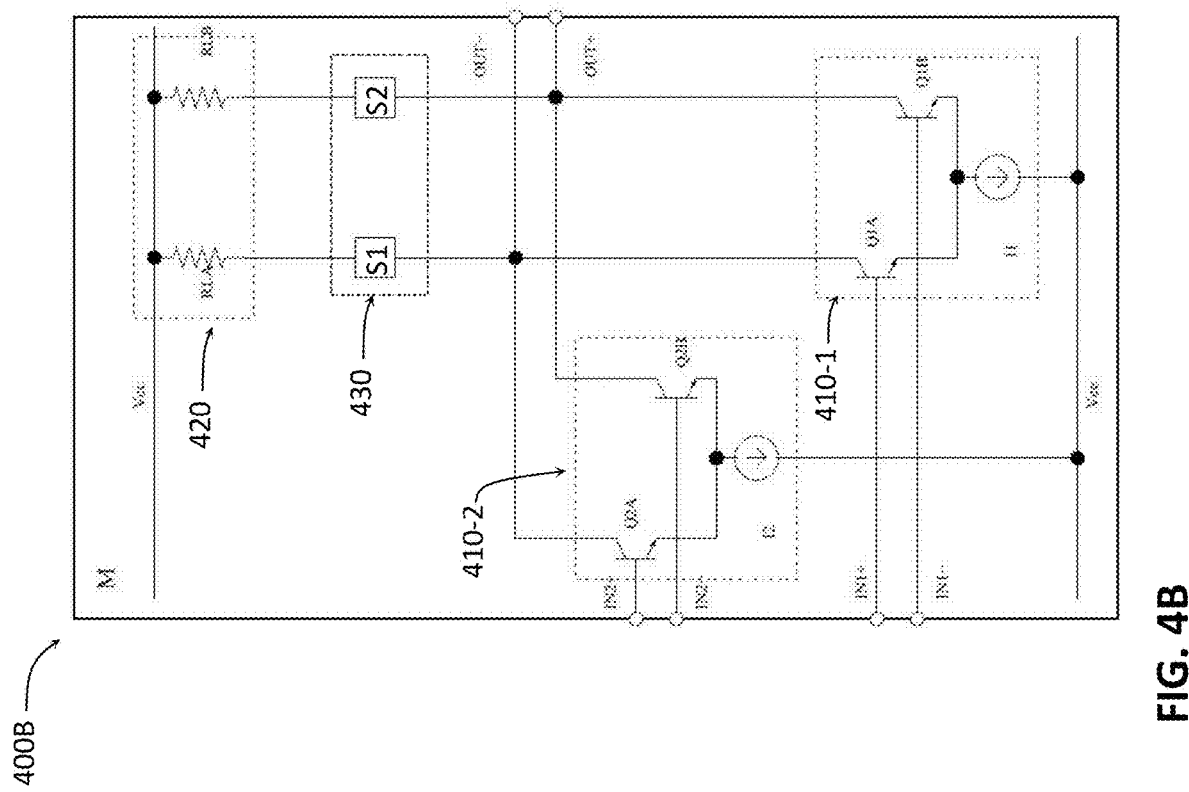

FIGS. 4A-4B are electric circuit diagrams showing a modular analog signal multiplexer with two channels according to various embodiments of the present disclosure.

FIG. 4A proposes an extendable, modular analog signal multiplexer 400A with two additional terminals TERM+ and TERM−, according to some embodiments of the present disclosure. The analog signal multiplexer 400A may, e.g., be an output stage for the TIA 104 shown in FIG. 1, where the outputs shown in FIG. 1 as out and outbar are provided to the analog signal multiplexer 400A as, respectively, inputs IN1+ and IN1− of the first input signal IN1. With such a use of the analog signal multiplexer 400A, there may be another TIA, similar to the TIA 104 (such other TIA not shown in FIG. 1), where the differential outputs of that other TIA could be provided to the analog signal multiplexer 400A as inputs IN2+ and IN2− of the second input signal IN2. Then, instead of providing the outputs of the TIAs to the ADC 106 directly, as shown in FIG. 1, the input to the ADC 106 would be the differential output signal at the output terminals OUT+ and OUT−, shown in FIG. 4A.

Thus, similar to the illustration of FIG. 3, the analog signal multiplexer 400A is shown to have two channels (although the multiplexer 400A may have more than 2 channels in other embodiments without departing from the scope of the present disclosure). Each channel may have a separate input signal path with the outputs of the channels combined in a common output signal path. For example, channel 1 may include input terminals IN1+ and IN1−, coupled to a differential pair 410-1 that may include emitter-coupled transistors Q1A and Q1B biased by a current source I1. Similarly, channel 2 may include input terminals IN2+ and IN2−, coupled to a differential pair 410-2 that may include emitter-coupled transistors Q2A and Q2B biased by a current source I2. In some embodiments, each of the differential pairs 410-1 and 410-2 may be a different instance of the differential pair 210 shown in FIG. 2.

Similar to the arrangement of the multiplexer 300, channel 1 or channel 2 can be coupled to the output of the multiplexer 400A by selective enabling of current sources I1 and I2. To select channel 1, I1 can be activated while I2 is turned off. To select channel 2, I2 can be activated while I1 is turned off. Also similar to the multiplexer 300, the multiplexer 400A can also be configured to sum channels 1 and 2 if both I1 and I2 are activated at the same time, or both channels can be isolated from the outputs by turning off I1 and I2 at the same time. The transconductance of each differential pair may be set by means of a gain setting resistor in the emitter of each transistor. The multiplexer 400A can also be configured as a programmable gain amplifier by shorting input terminals IN1+ to IN2+ and IN1− to IN2− where each differential pair may have a different current gain.

Continuing with further similarities to the illustration of FIG. 3, the analog signal multiplexer 400A may include a passive load 420, similar to the load 220 described with referenced to FIG. 2. Thus, the passive load 420 may include two load elements, e.g., two resistors, shown in FIG. 4A as resistors RLA and RLB. However, in sharp contrast to the illustration of FIG. 3, in the analog signal multiplexer 400A the terminal OUT− and the collectors of Q1A and Q2A are not directly coupled to the resistor RLA, while the terminal OUT+ and the collectors of Q1B and Q2B are not directly coupled to the resistor RLB. Instead, the multiplexer 400A includes an additional differential pair of terminals, shown as terminals TERM− and TERM+, and the load resistors RLA and RLB may be coupled to terminals TERM− and TERM+, respectively. Because the load resistors RLA and RLB are not coupled to the differential pairs 410-1 and 410-2 and to the output terminals OUT+ and OUT− directly, they may be referred to as "uncommitted." As will be shown below, including such uncommitted load resistors RLA and RLB enables assembling one or many analog signal multiplexers 400A with a minimal number of additional components, if any.

FIG. 4B proposes an extendable, modular analog signal multiplexer 400B with a switch arrangement 430, according to some embodiments of the present disclosure. The multiplexer 400B is similar to the multiplexer 400A shown in FIG. 4A, so that, in the interests of brevity, the descriptions provided with reference to the multiplexer 400A are not repeated for the multiplexer 400B, and only the differences are described. As shown in FIG. 4B, the multiplexer 400B does not include the two additional terminals TERM+ and TERM− that were included in the multiplexer 400A. Instead, the passive load 420 is coupled to the output terminals OUT+ and OUT− of the multiplexer 400B via the switch arrangement 430. The switch arrangement 430 may include two switches S1 and S2. In some embodiments, the switch S1 may be coupled between the load resistor RLA and the terminal OUT−, while the switch S2 may be coupled between the load resistor RLB and the terminal OUT+, as shown in FIG. 4B. In other embodiments (not specifically shown in the present drawings), the switch S1 may be coupled between the load resistor RLA and the power supply (e.g., Vcc shown in FIG. 4B), while the switch S2 may be coupled between the load resistor RLB and the power supply (e.g., Vcc shown in FIG. 4B). Such switches between the supply and the load may be particularly advantageous for high-speed applications and/or for reliability reasons (e.g., less voltage may be on the turned-on switch). Although not specifically shown in subsequent drawings illustrating switches, such a variation may also be applied therein. The switch arrangement 430 may be configured to either couple the load 420 to the output terminals OUT+ and OUT− of the multiplexer 400B (e.g., when the switches S1, S2 are closed), resulting in the multiplexer 400B being configured to function substantially as the multiplexer 300 shown in FIG. 3, or de-couple the load 420 from the output terminals OUT+ and OUT−, leaving the load resistors RLA and RLB uncommitted (as they are in the multiplexer 400A shown in FIG. 4A).

Figure 5A:
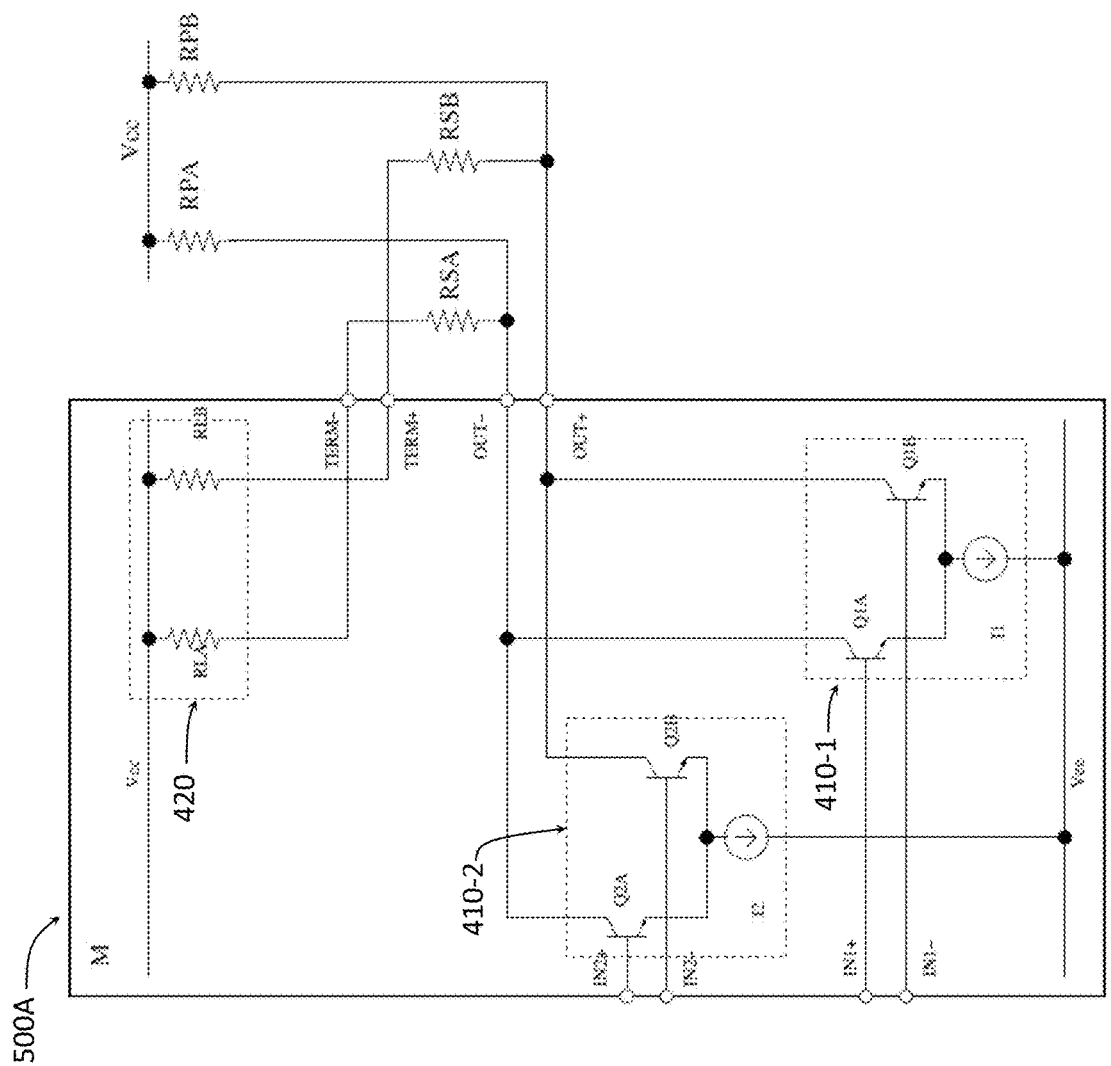
FIGS. 5A-5C are electric circuit diagrams showing an assembly using a single modular analog signal multiplexer with two channels according to various embodiments of the present disclosure.
Figure 5B:
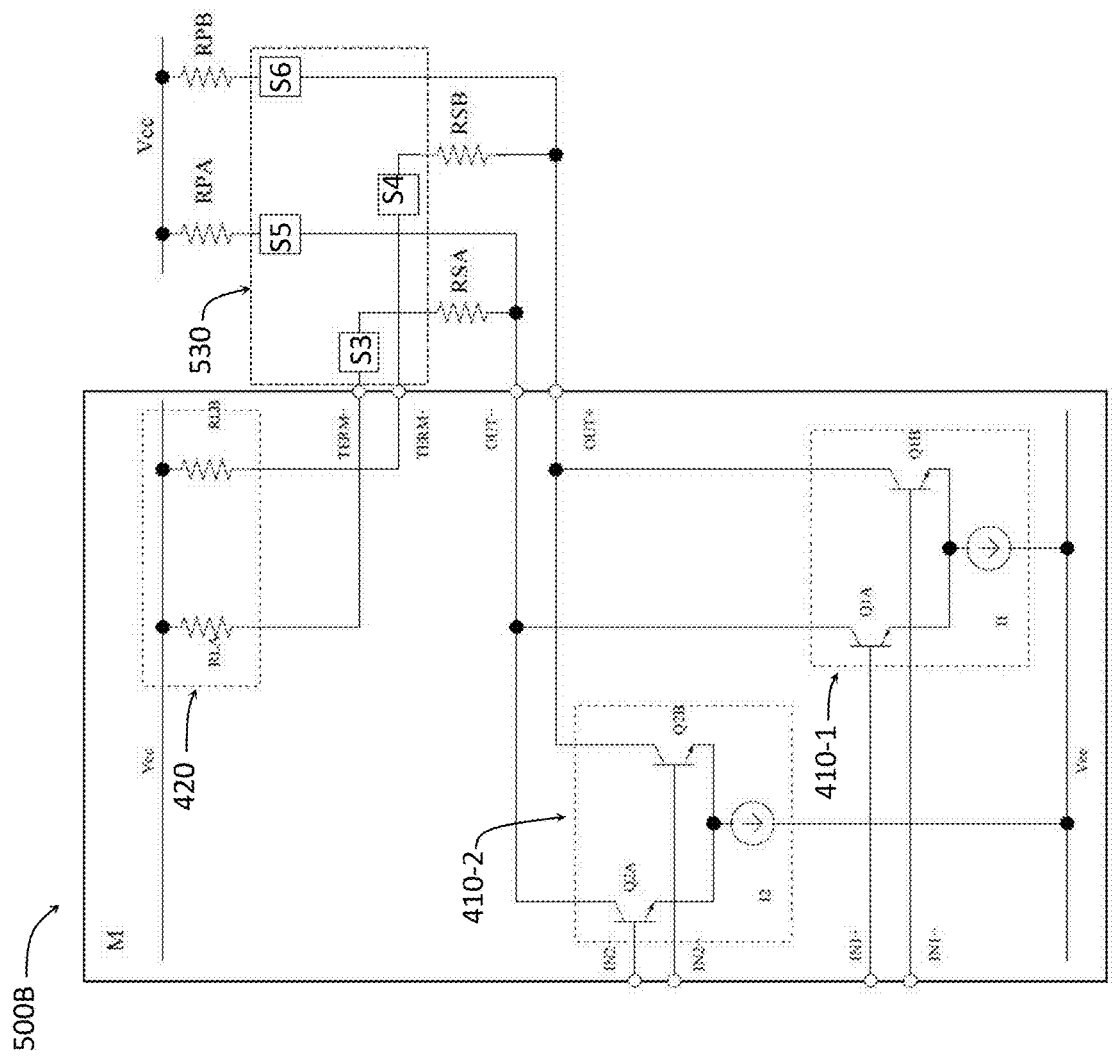

In general, the multiplexers 400A and 400B may be described as being configured to operate in one of two modes. In the first mode the load 420 is coupled to the output of the multiplexer 400A/400B, and in the second mode the load 420 is de-coupled from the output of the multiplexer 400A/400B. The multiplexer 400A may be configured for operation in the first mode when the additional output terminals TERM+ and TERM− are coupled to, respectively, the output terminals OUT+ and OUT−, e.g., as is shown in FIG. 5A or 5B. The multiplexer 400A may be configured for operation in the second mode when the additional output terminals TERM+ and TERM− are not coupled to the output terminals OUT+ and OUT−, e.g., as is shown in FIG. 4A. The multiplexer 400B may be configured for operation in the first mode when the switch arrangement 430 is in such a configuration that current may flow between the load 420 and the output terminals OUT+ and OUT− (e.g., when the switches shown in FIG. 4B are closed). The multiplexer 400B may be configured for operation in the second mode when the switch arrangement 430 is in such a configuration that current may not flow between the load 420 and the output terminals OUT+ and OUT− (e.g., when the switches shown in FIG. 4B are open).

Figure 5C:
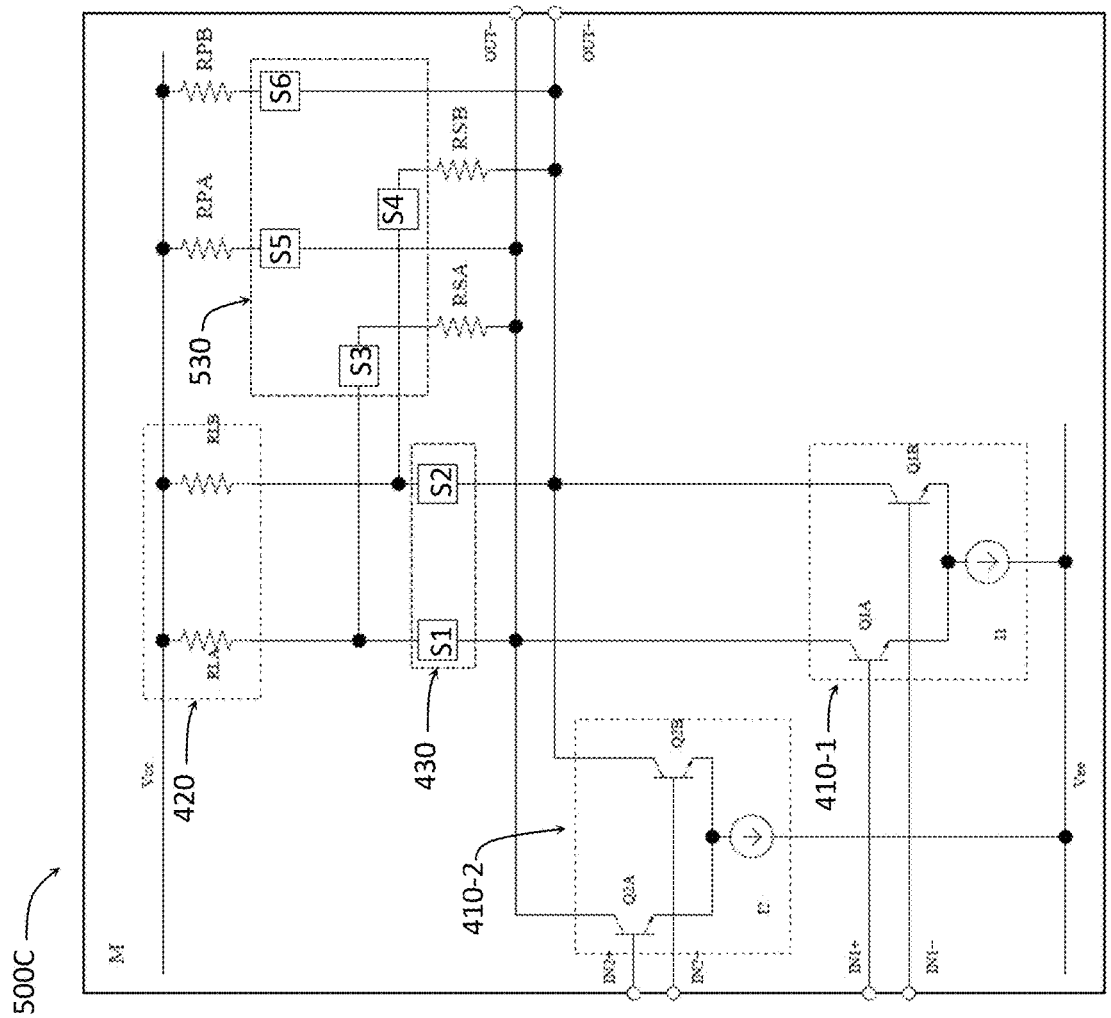

FIGS. 5A-5C are electric circuit diagrams showing an assembly using a single modular analog signal multiplexer with two channels according to various embodiments of the present disclosure.

FIG. 5A is an electric circuit diagram showing an assembly 500A that uses a single modular analog signal multiplexer with two channels, e.g., the multiplexer 400A shown in FIG. 4A, according to some embodiments of the present disclosure. As shown in FIG. 5A, a single instance of the proposed extendable analog signal multiplexer 400A may further include two additional series resistors, shown in the assembly 500A as resistors RSA and RSB. Additionally or alternatively to the additional series resistors RSA and RSB, the assembly 500A may further include two additional parallel resistors, shown as resistors RPA and RPB. In general, leaving the output at the terminals OUT+ and OUT− in the current mode and including the series resistors RSA and RSB and/or the parallel resistors RPA and RPB allows modifying the values of these resistors to obtain the voltage output that may be desirable for a particular application in terms of impedance, gain, power, etc. In general, the series resistors can be implemented to increase the effective resistance of the load resistors RLA and RLB, while the parallel resistors can be implemented to decrease the effective resistance of the load resistors RLA and RLB. For example, if RSA=RSB=0 (or a relatively small resistance) and RPA=RPB=infinity (or a relatively large resistance that may be approximated to infinity in terms of its electrical characteristics), then the terminal OUT− of the assembly 500A is shorted to terminal TERM− and terminal OUT+ is shorted to terminal TERM+ (i.e., the multiplexer 400A of the assembly 500A is configured for operation in the first mode), and the extendable analog signal multiplexer 400A within the assembly 500A is equivalent to the multiplexer shown in FIG. 3. On the other hand, if RSA and RSB have relatively large resistance (e.g., a relatively large resistance that may be approximated to infinity in terms of its electrical characteristics), then the terminal OUT− of the assembly 500A is not coupled to the terminal TERM− and the terminal OUT+ is not coupled to the terminal TERM+ (i.e., the multiplexer 400A of the assembly 500A is configured for operation in the second mode), and the extendable analog signal multiplexer 400A within the assembly 500A is equivalent to the multiplexer shown in FIG. 4A. In some embodiments, some or all of the resistors RSA RSB, RPA, RPB may be variable resistors where their resistance may be varied to place the multiplexer 400A in either the first mode or the second mode of operation.

In other embodiments of an assembly that uses a single modular analog signal multiplexer with two channels, not specifically shown in the present figures, the terminal OUT− of the multiplexer 400A may be shorted to terminal TERM− and the terminal OUT+ of the multiplexer 400A may be shorted to terminal TERM+ without the use of the resistors as shown in the assembly 500A.

FIG. 5B is an electric circuit diagram showing an assembly 500B that uses a single modular analog signal multiplexer with two channels, e.g., the multiplexer 400A shown in FIG. 4A, according to other embodiments of the present disclosure. The assembly 500B is similar to the assembly 500A shown in FIG. 5A, so that, in the interests of brevity, the descriptions provided with reference to the assembly 500A are not repeated for the assembly 500B, and only the differences are described. As shown in FIG. 5B, the assembly 500B still includes the two additional terminals TERM+ and TERM− that were included in the assembly 500A, but, in contrast to the assembly 500A, the assembly 500B further includes a switch arrangement 530 that may include a plurality of switches, e.g., switches S3-S6 as shown in FIG. 5B. The switch arrangement 530 is configured to selectively couple various ones of the additional series resistors RSA and RSB and additional parallel resistors RPA and RPB to the output terminals OUT+ and OUT−. For example, if RSA=RSB=0 (or a relatively small resistance) and RPA=RPB=infinity (or a relatively large resistance that may be approximated to infinity in terms of its electrical characteristics) and the switches S3-S6 are closed, then the terminal OUT− of the assembly 500A is shorted to terminal TERM− and terminal OUT+ is shorted to terminal TERM+ (i.e., the multiplexer 400A of the assembly 500A is configured for operation in the first mode), and the extendable analog signal multiplexer 400A within the assembly 500A is equivalent to the multiplexer shown in FIG. 3. On the other hand if the switches S3 and S4 are open, then the terminal OUT− of the assembly 500A is not coupled to the terminal TERM− and the terminal OUT+ is not coupled to the terminal TERM+ and the multiplexer 400A of the assembly 500B is configured for operation in the second mode. Further possibilities for varying the values of the resistors RSA RSB, RPA, RPB and the closed or open positions of the switches S3-S6 are possible to configure the multiplexer 400A of the assembly 500B for operation in the first or the second mode, all of which being within the scope of the present disclosure. Similar to the assembly 500A, in some embodiments, some or all of the resistors RSA RSB, RPA, RPB may be variable resistors where their resistance may be varied to place the multiplexer 400A of the assembly 500B in either the first mode or the second mode of operation.

FIG. 5C is an electric circuit diagram showing an assembly 500C that uses a single modular analog signal multiplexer with two channels, e.g., the multiplexer 400B shown in FIG. 4B, according to other embodiments of the present disclosure. The assembly 500C is similar to the assembly 500B shown in FIG. 5B, so that, in the interests of brevity, the descriptions provided with reference to the assembly 500B are not repeated for the assembly 500C, and only the differences are described. Similar to the assembly 500B, the assembly 500C includes the switching arrangement 530. However, in contrast to the assembly 500B where the multiplexer was the multiplexer 400A of FIG. 4A, the multiplexer of the assembly 500C is the multiplexer 400B of FIG. 4B. Thus, the assembly 500C may be seen as a combination of the embodiment shown in FIG. 4B and the embodiment shown in FIG. 5B and the combination of the descriptions provided with reference to these drawings is applicable to the assembly 500C shown in FIG. 5C. Various possibilities for varying the values of the resistors RSA RSB, RPA, RPB and the closed or open positions of the switches S1-S2 of the switch arrangement 430 and the switches S3-S6 of the switch arrangement 530 are possible to configure the multiplexer 400B of the assembly 500C for operation in the first or the second mode, all of which being within the scope of the present disclosure.

While FIGS. 4A-4B and FIGS. 5A-5C illustrate some example implementation of the modular analog signal multiplexers 400A/400B, some variations may be made to the multiplexers 400A/400B without departing from the general ideas presented herein, all embodiments of such variations being included within the broad scope of the present disclosure. Some of these variations will now be described.

Figure 6A:
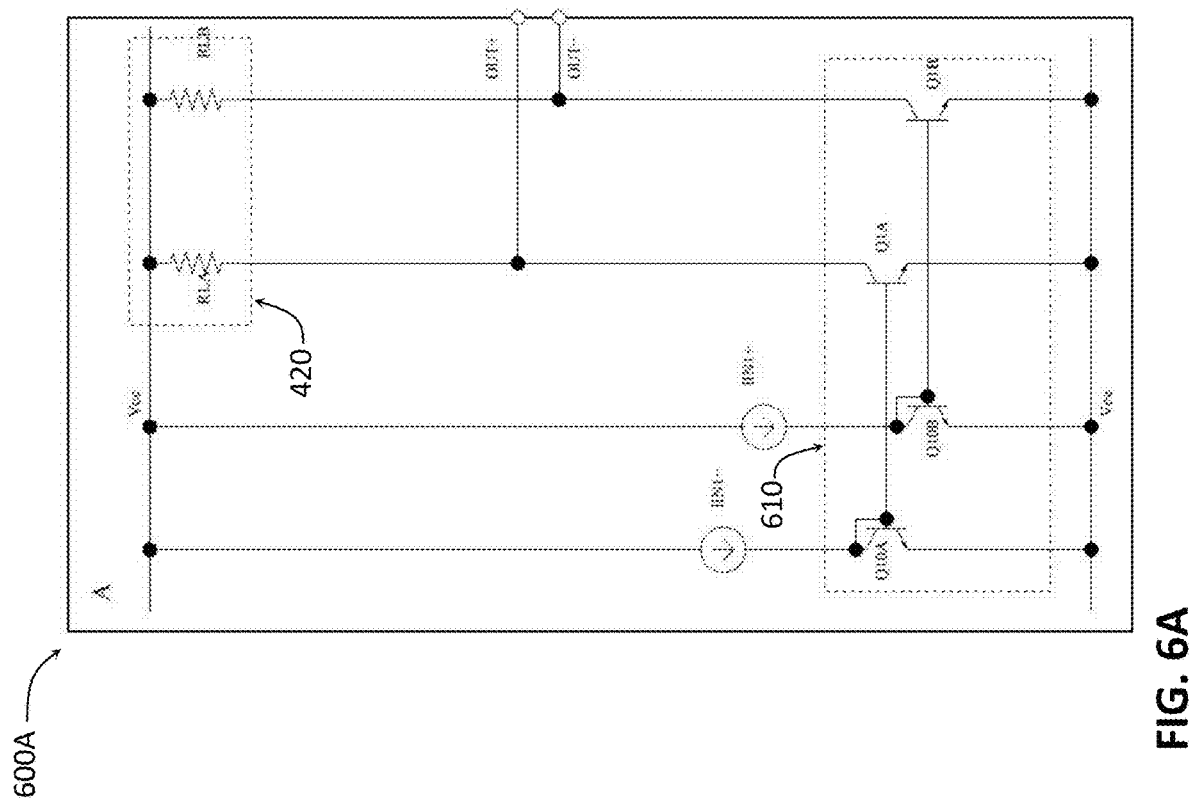
FIGS. 6A-6C are electric circuit diagrams illustrating the use of a differential current mirror instead of a differential pair according to various embodiments of the present disclosure.

The multiplexers 400A/400B shown in FIGS. 4A-4B and FIGS. 5A-5C illustrate differential pairs 410-1 and 410-2 because the differential pair is one of the most common output stages. However, in other embodiments of the multiplexers 400A/400B, each of the differential pairs 410-1 and 410-2 may be replaced with a current mirror output stage. Such embodiments may be more preferable when, e.g., output swing needs to be maximized at low supply voltages. FIG. 6A shows a differential amplifier 600A as an example of an output stage where a differential current mirror 610 is used. The differential amplifier 600A is analogous to the differential amplifier 200 shown in FIG. 2, except that the differential pair 210 is replaced with the differential current mirror 610. As shown in FIG. 6A, the differential current mirror 610 may include two current mirrors—the first current mirror formed by the transistors Q10A and Q1A and driven by the input current IIN1−, the second current mirror formed by the transistors Q10B and Q1B and driven by the input current IIN1+, where the currents IIN1− and IIN1+ are differential input currents (i.e., one of the currents IIN1− and IIN1+ may be based on a difference of the bias current IB and the input current IIN1, while the other one of the currents IIN1− and IIN1+ may be based on a sum of the bias current IB and the input current IIN1). Currents IIN+ and IIN− may be output currents from, e.g., a differential pair, a current mirror, or any other component that can provide differential currents IIN+ and IIN−. In some embodiments, the ratio of the emitter area of the transistor Q1A to the emitter area of Q10A is G:1 and the ratio of the emitter area of the transistor Q1B to the emitter area of Q10B may be G:1 for a gain of G (in the present disclosure, all components denoted A and B are assumed to be substantially identical, e.g., Q10A and Q10B).

Figure 6B:
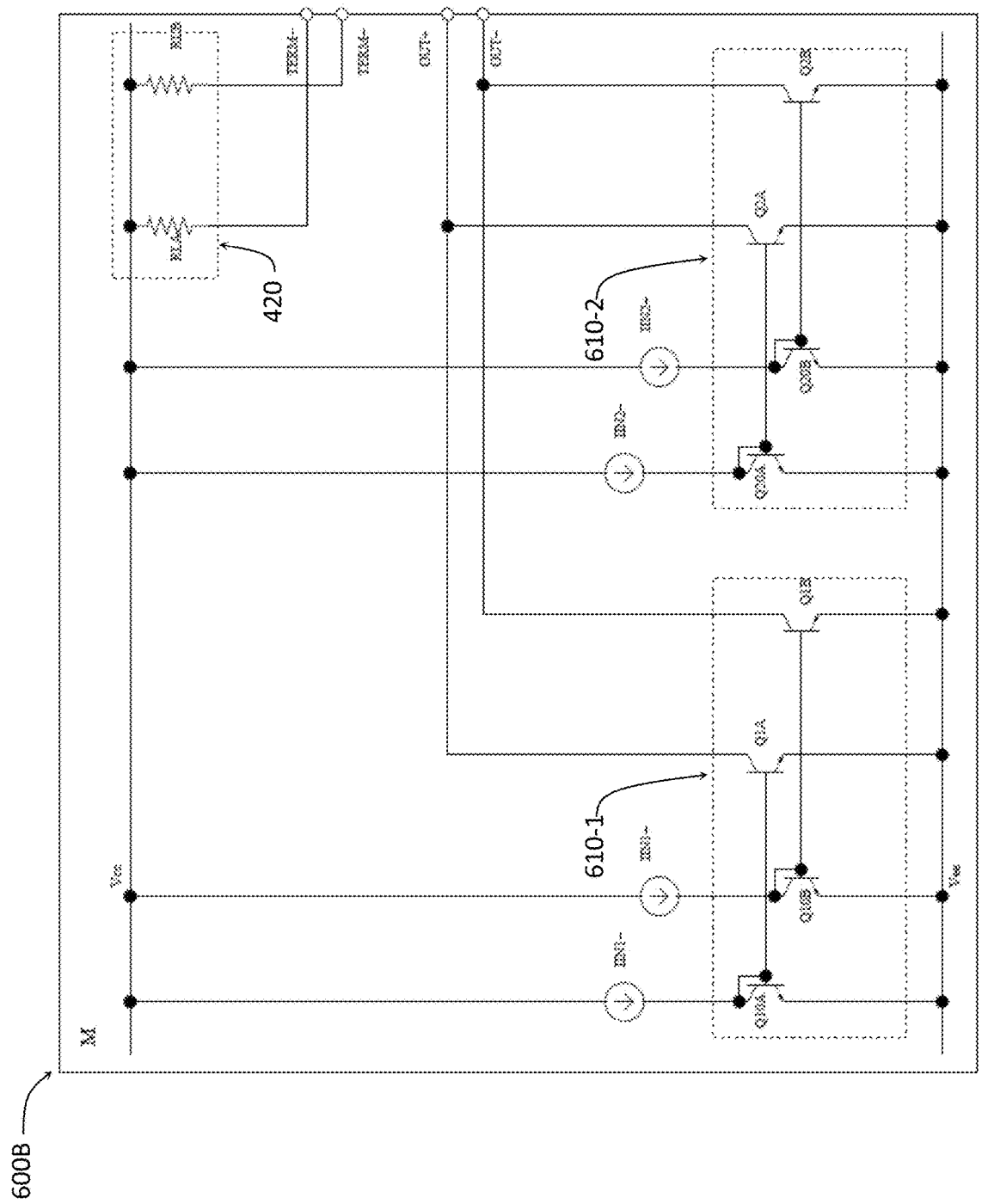
Figure 6C:
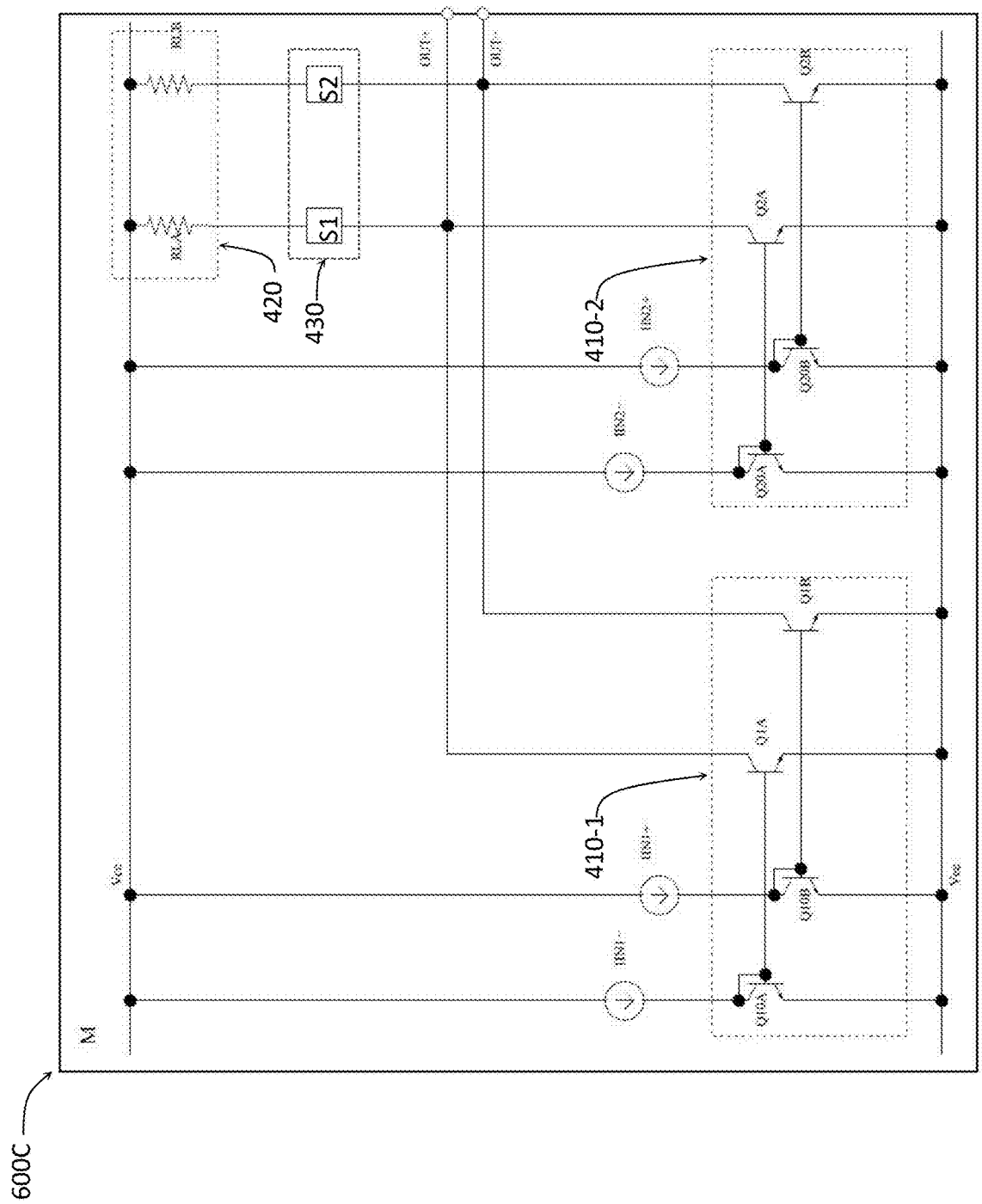

In various variations of the embodiments of the multiplexers 400A/400B (e.g., in various embodiments as shown in FIGS. 4A-4B or FIGS. 5A-5C), each of the differential pairs 410-1 and 410-2 may be replaced with a respective differential current mirror 610 as described above. For example, FIG. 6B illustrates an analog signal multiplexer 600B that is similar to the multiplexer 400A shown in FIG. 4A in that it includes the load 420 coupled to the additional terminals TERM− and TERM+ as described above, except that instead of having the output stages 410-1 and 410-2 implemented as differential pairs, the multiplexer 600B employs the differential current mirrors 610-1 and 610-2 (i.e., two different instances of the differential current mirror 610 as described above). Thus, the multiplexer 600B may be seen as a combination of the embodiment shown in FIG. 4A and the embodiment shown in FIG. 6A and the combination of the descriptions provided with reference to these drawings is applicable to the multiplexer 600B shown in FIG. 6B. Descriptions as to how to operate the multiplexer 400A in the first or the second mode are applicable to the multiplexer 600B and, therefore, in the interests of brevity, are not repeated. In another example, FIG. 6C illustrates an analog signal multiplexer 600C that is similar to the multiplexer 400B shown in FIG. 4B in that it includes the load 420 coupled to the switch arrangement 430 as described above, except that instead of having the output stages 410-1 and 410-2 implemented as differential pairs, the multiplexer 600C employs the differential current mirrors 610-1 and 610-2 (i.e., two different instances of the differential current mirror 610 as described above). Thus, the multiplexer 600C may be seen as a combination of the embodiment shown in FIG. 4B and the embodiment shown in FIG. 6A and the combination of the descriptions provided with reference to these drawings is applicable to the multiplexer 600C shown in FIG. 6C. Descriptions as to how to operate the multiplexer 400B in the first or the second mode are applicable to the multiplexer 600C and, therefore, in the interests of brevity, are not repeated.

Although not specifically shown in the present drawings, embodiments of the assemblies 500A-500C as shown in FIGS. 5A-5C but with the differential pairs 410-1 and 410-2 being replaced with the differential current mirrors 610-1 and 610-2 are possible and within the scope of the present disclosure.

Continuing with the variations of the various embodiments of the multiplexers 400A/400B and 600B/600C, as well as embodiments of any these multiplexers included in any of the assemblies described with reference to FIGS. 5A-5C, in the present disclosure, for simplicity, the differential pairs or the differential current mirrors shown in the figures do not explicitly show resistors at the emitters of the transistors employed in these circuit blocks. However, in further variations, one or more resistors may be coupled to the emitters of any of these transistors. For example, in various embodiments of the multiplexers 400A/400B and 600B/600C, as well as embodiments of any these multiplexers included in any of the assemblies described with reference to FIGS. 5A-5C, the transconductance of each differential pair 410 or differential current mirror 610 may be set by means of a gain setting resistor in the emitter of each transistor of the differential pair 410 or differential current mirror 610.

While various embodiments of the multiplexers 400A/400B and 600B/600C illustrate example with two input channels and one differential output OUT+, OUT−, in other embodiments, any of the multiplexers 400A/400B and/or 600B/600C, as well as embodiments of any these multiplexers included in any of the assemblies described with reference to FIGS. 5A-5C, may include more than two input channels and multiple differential outputs OUT+, OUT−, as long as the number of the outputs is less than the number of inputs. Furthermore, in other embodiments, any of the multiplexers 400A/400B and 600B/600C as described above (possibly in any of the assemblies as shown in FIGS. 5A-5C) may include only one input channel (i.e., only one differential pair 410 or differential current mirror 610).

Still further, various embodiments of the multiplexers 400A/400B and 600B/600C, as well as embodiments of any these multiplexers included in any of the assemblies described with reference to FIGS. 5A-5C, may have additional passive and/or active components to set or regulate the desired common-mode output voltage, for example to match the input common-mode of an ADC. Additional parallel resistors RPA and RPB may be also coupled to a power supply voltage larger than Vcc to allow high voltage operation beyond the supply Vcc of the multiplexer.

Continuing with the variations to the various embodiments of the multiplexers 400A/400B and 600B/600C, as well as embodiments of any these multiplexers included in any of the assemblies described with reference to FIGS. 5A-5C further, while illustrations of FIGS. 4A-4B, 5A-5C, and 6A-6C are provided for circuits that employ bipolar transistors, these descriptions may be easily adapted to circuits that employ FETs, or a combination of bipolar and FET technologies. Furthermore, while some descriptions may refer to N-type transistors (e.g., NPN transistors for those transistors that are implemented using bipolar technology or NMOS transistors for those transistors that are implemented as FETs), these descriptions may be easily adapted to circuits that employ P-type transistors (e.g., PNP transistors for those transistors that are implemented using bipolar technology or PMOS transistors for those transistors that are implemented as FETs) instead of N-type transistors, and vice versa. Therefore, all of these variations are within the scope of the present disclosure. In some embodiments, Vee shown in the present figures may be replaced with any negative supply voltage for the complementary version of the multiplexer M, e.g., when all N-type transistors are replaced with P-type transistors.

Arranging Multiple Modular Analog Signal Multiplexers Together

FIGS. 4A-4B, 5A-5C, and 6A-6C, as well as further embodiments of analog signal multiplexers as shown in these drawings as described herein all relate to single instances of the multiplexer. In further embodiments, any of the multiplexers described above may be combined with any other multiplexers, all of which embodiments being within the scope of the present disclosure. Some examples of such combinations are shown in FIGS. 7A-7E.

Figure 7A:
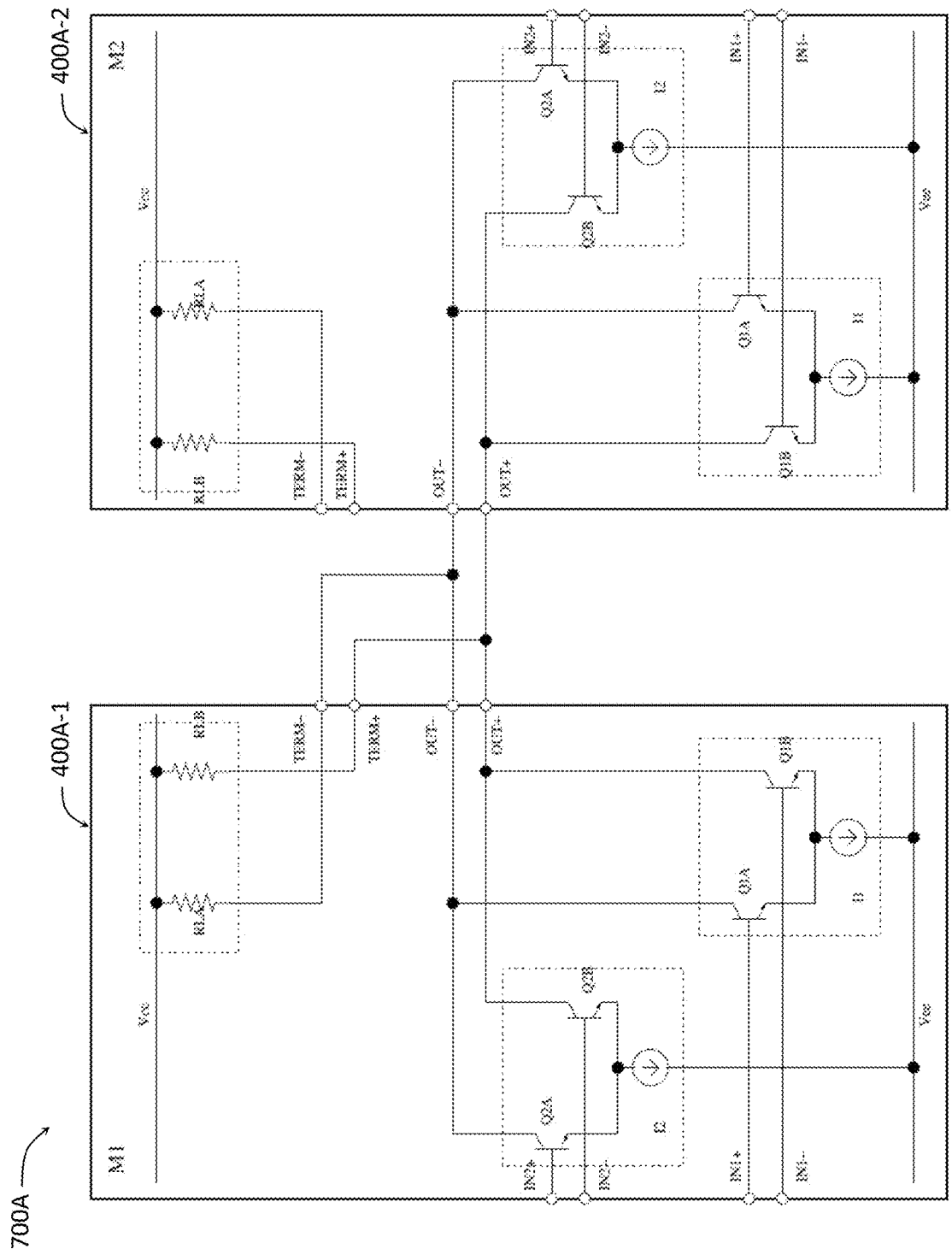
FIG. 7A-7E are electric circuit diagrams showing an assembly using a combination of two modular analog signal multiplexers according to various embodiments of the present disclosure.

FIG. 7A is an electric circuit diagram showing an assembly 700A using a combination of two modular analog signal multiplexers, according to some embodiments of the present disclosure. In particular, the assembly 700A illustrates two multiplexers 400A-1 and 400A-2, each of which is a different instance of the multiplexer 400A shown in FIG. 4A, where the different reference numerals used in FIG. 4A are not used in FIG. 7A in order to not clutter the drawing. Descriptions as to how to operate any of the multiplexers 400A in the first or the second mode are applicable to the multiplexers 400A-1 and 400A-2 of the assembly 700A and, therefore, in the interests of brevity, are not repeated.

The assembly 700A illustrates an example of how to identical extendable analog signal multiplexers 400A, e.g., with two channels each (the multiplexers 400A-1 and 400A-2 denoted M1 and M2, respectively) can be combined to construct the assembly 700A which provides a four channel multiplexer. In general, any number N of multiplexers 400A may be combined (e.g., N may be an integer equal to or greater than 1), each multiplexer 400A including any number K of channels (e.g., K may be an integer equal to or greater than 1), to provide an assembly that is an N*K channel multiplexer. In such an assembly, the load resistors of one of the N multiplexers 400A may be used as the common load, while the load resistors of the remaining (N−1) multiplexers 400A may be left electrically floating (i.e., not connected to output terminals). In the assembly 700A, the load resistors RLA and RLB of the multiplexer 400A-1 are used as the common load, while the load resistors RLA and RLB of the multiplexer 400A-2 are not connected to the output terminals OUT− and OUT+ and may be left floating. In the assembly 700A, the additional terminal TERM− of the multiplexer 400A-1 may be coupled (e.g., shorted, as shown in FIG. 7A) to the OUT− terminal of the multiplexer 400A-1 as well as to the OUT− terminal of the multiplexer 400A-2. Furthermore, the additional terminal TERM+ terminal of the multiplexer 400A-1 may be coupled (e.g., shorted, as shown in FIG. 7A) to the OUT+ terminal of the multiplexer 400A-1 as well as to the OUT+ terminal of the multiplexer 400A-2. Although not specifically shown in FIG. 7A, in other embodiments of the assembly 700A, one or more resistors or other circuit elements may be used to couple the additional terminal TERM− of the multiplexer 400A-1 to the OUT− terminal of the multiplexer 400A-1 as well as to the OUT− terminal of the multiplexer 400A-2, and/or one or more resistors or other circuit elements may be used to couple the additional terminal TERM+ of the multiplexer 400A-1 to the OUT+ terminal of the multiplexer 400A-1 as well as to the OUT+ terminal of the multiplexer 400A-2.

In the assembly 700A, selective activation of current sources in each of the analog signal multiplexers can be used to couple or isolate any input channel from the outputs. To select channel 1 of M1, I1 in M1 can be activated while all the other current sources of M1 and M2 are turned off. To select channel 2 of M1, I2 in M1 can be activated while all the other current sources of M1 and M2 are turned off. To select channel 1 of M2, I1 in M2 can be activated while all the other current sources of M1 and M2 are turned off. To select channel 2 of M2, I2 in M2 can be activated while all the other current sources of M1 and M2 are turned off. The multiplexer of the assembly 700A can also be configured to sum any combination of channels 1 and 2 of any of the multiplexers M1 and M2 by selectively activating if multiple respective current sources at the same time, or all channels can be isolated from the outputs by turning off I1 and I2 of both multiplexers M1 and M2 at the same time, similar to the functionality described with reference to FIG. 3.

Figure 7B:
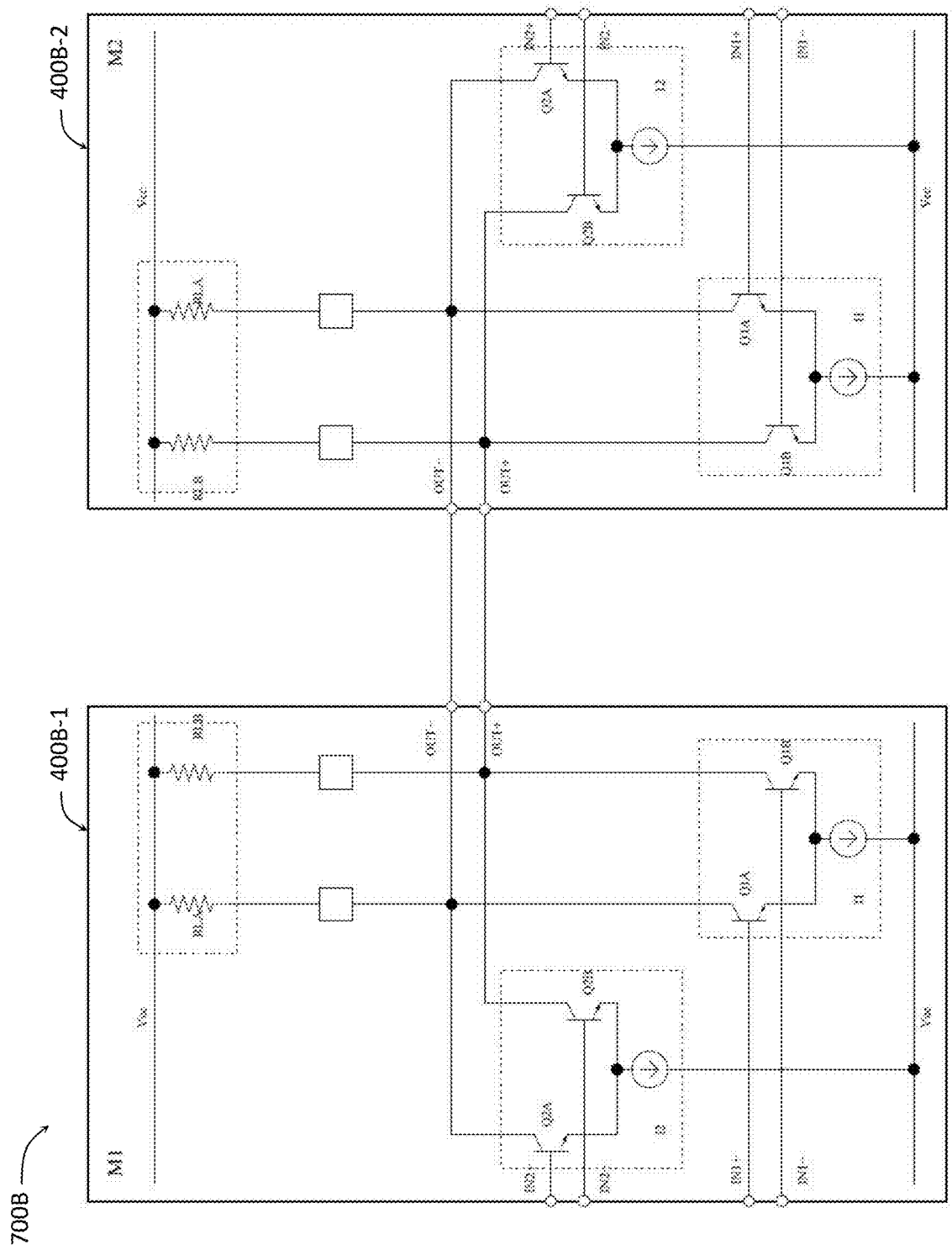

FIG. 7B is an electric circuit diagram showing an assembly 700B using another combination of two modular analog signal multiplexers, according to some embodiments of the present disclosure. In particular, the assembly 700B illustrates two multiplexers 400B-1 and 400B-2, each of which is a different instance of the multiplexer 400B shown in FIG. 4B, where the different reference numerals used in FIG. 4B are not used in FIG. 7B in order to not clutter the drawing. The assembly 700B may be seen as a combination of the embodiment shown in FIG. 4B and the embodiment shown in FIG. 7A and the combination of the descriptions provided with reference to these drawings is applicable to the assembly 700B shown in FIG. 7B. Descriptions as to how to operate any of the multiplexers 400B in the first or the second mode are applicable to the multiplexers 400B-1 and 400B-2 of the assembly 700B and, therefore, in the interests of brevity, are not repeated.

Figure 7C:
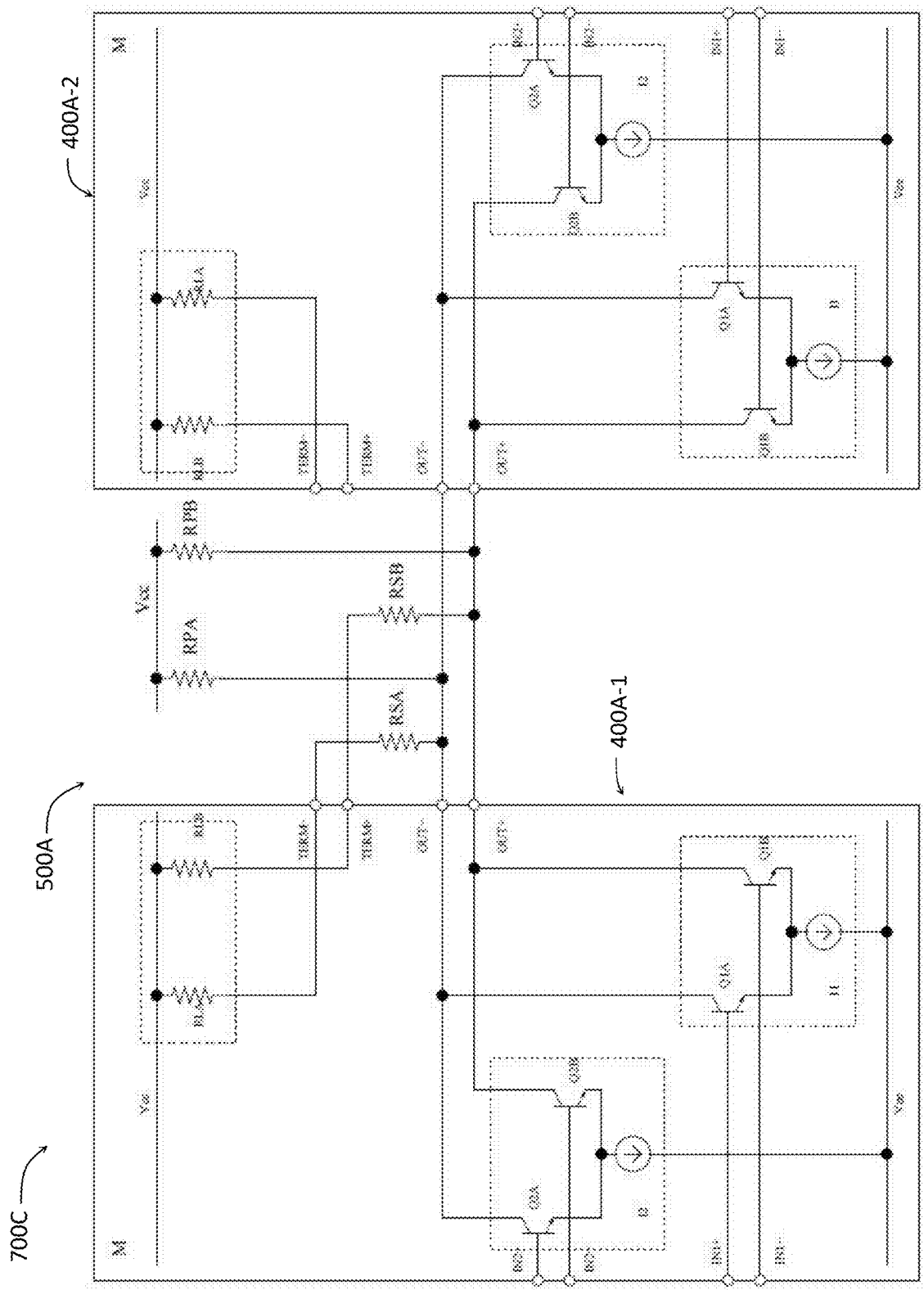

FIG. 7C is an electric circuit diagram showing an assembly 700C using yet another combination of two modular analog signal multiplexers, according to some embodiments of the present disclosure. In particular, the assembly 700C illustrates two multiplexers 400A-1 and 400A-2, each of which is a different instance of the multiplexer 400A shown in FIG. 4A but where the multiplexer 400A-1 is included within the assembly 500A as shown in FIG. 5A, where the different reference numerals used in FIG. 4A and FIG. 5A are not used in FIG. 7C in order to not clutter the drawing. The assembly 700C may be seen as a combination of the embodiment shown in FIG. 5A and the embodiment shown in FIG. 7A and the combination of the descriptions provided with reference to these drawings is applicable to the assembly 700C shown in FIG. 7C. Descriptions as to how to operate any of the multiplexers 400A in the first or the second mode are applicable to the multiplexers 400A-1 and 400A-2 of the assembly 700C and, therefore, in the interests of brevity, are not repeated.

Figure 7D:
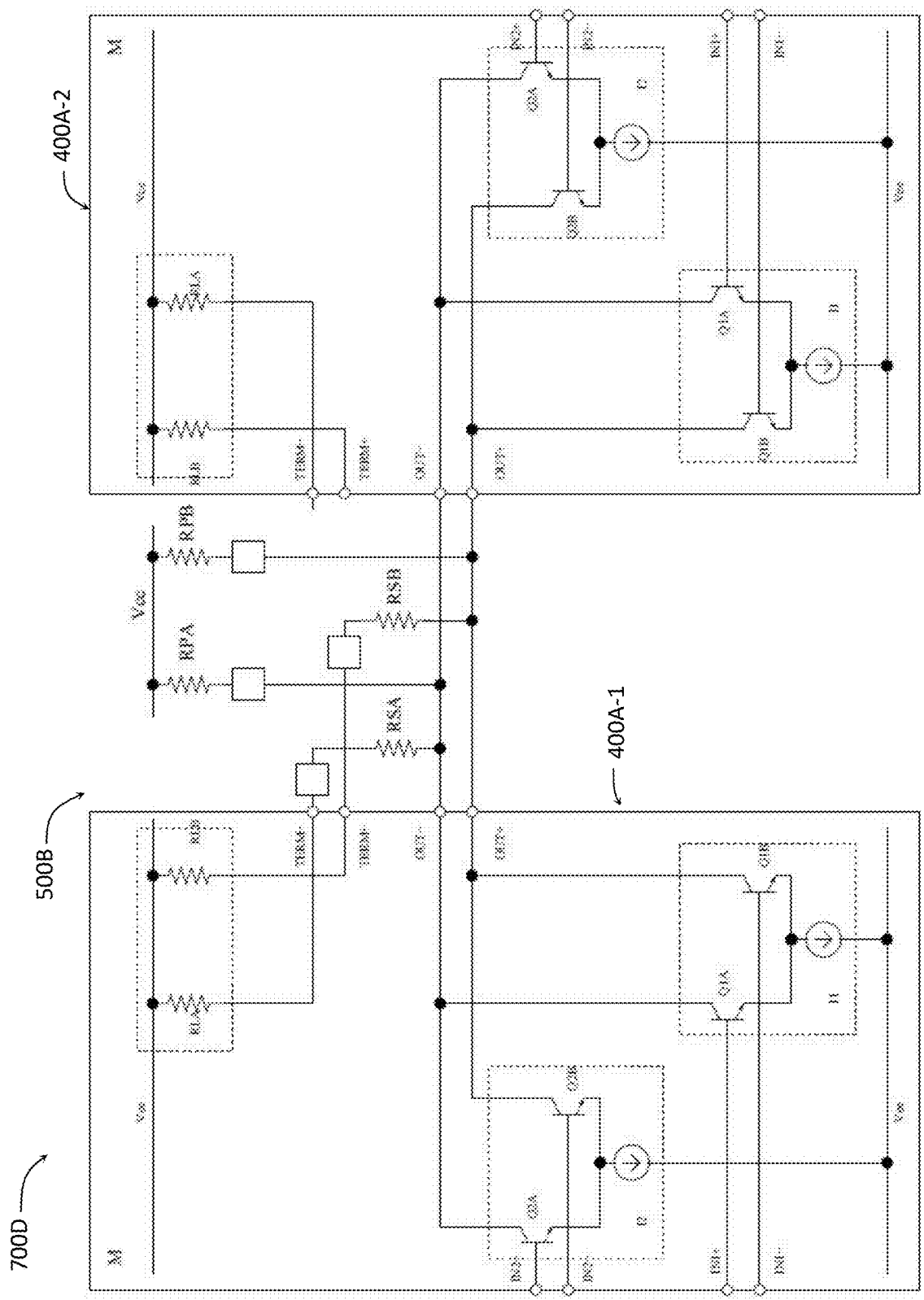

FIG. 7D is an electric circuit diagram showing an assembly 700D using still another combination of two modular analog signal multiplexers, according to some embodiments of the present disclosure. In particular, the assembly 700D illustrates two multiplexers 400A-1 and 400A-2, each of which is a different instance of the multiplexer 400A shown in FIG. 4A but where the multiplexer 400A-1 is included within the assembly 500B as shown in FIG. 5B, where the different reference numerals used in FIG. 4A and FIG. 5B are not used in FIG. 7D in order to not clutter the drawing. The assembly 700D may be seen as a combination of the embodiment shown in FIG. 5B and the embodiment shown in FIG. 7A and the combination of the descriptions provided with reference to these drawings is applicable to the assembly 700D shown in FIG. 7D. Descriptions as to how to operate any of the multiplexers 400A in the first or the second mode are applicable to the multiplexers 400A-1 and 400A-2 of the assembly 700D and, therefore, in the interests of brevity, are not repeated.

Figure 7E:
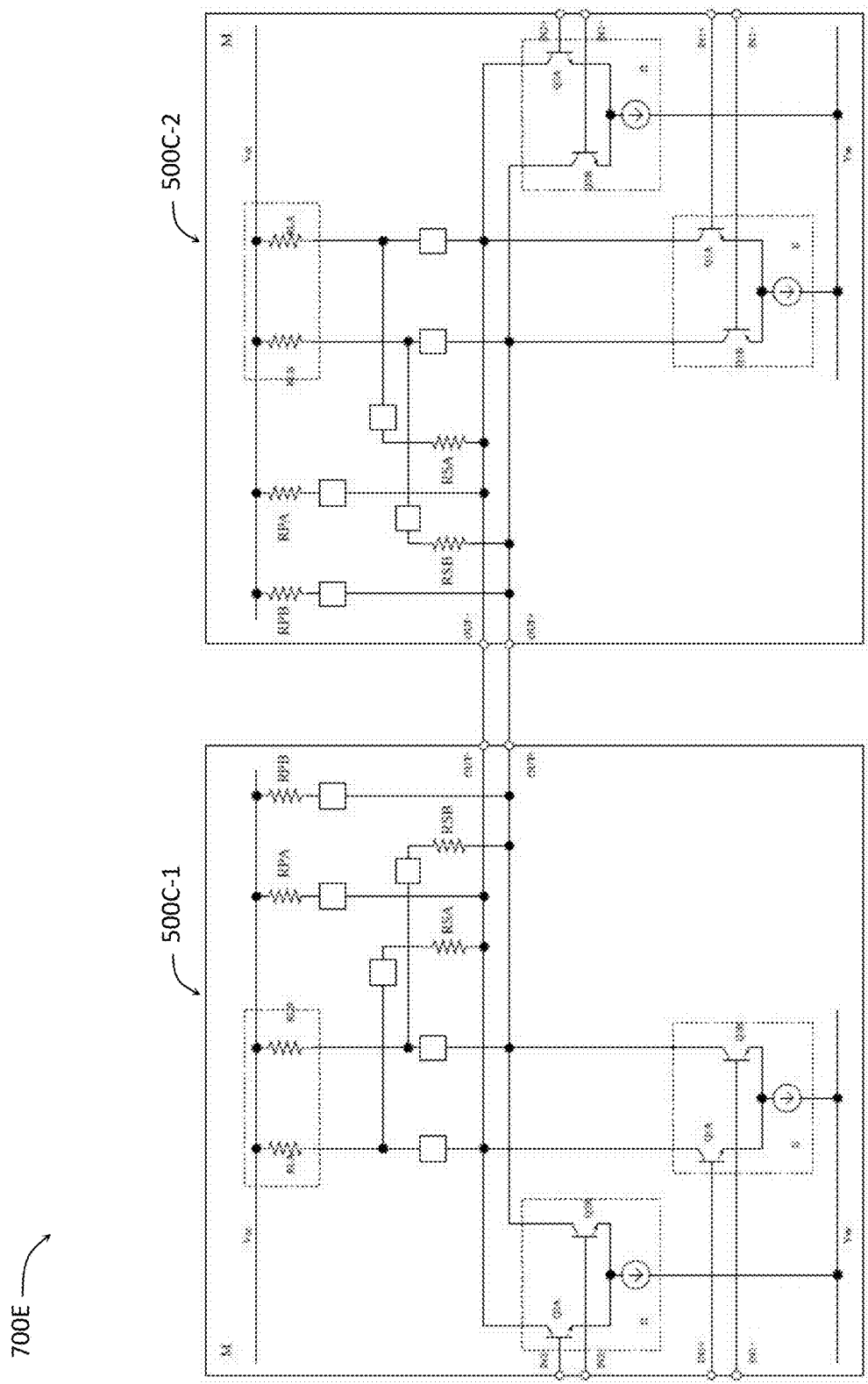

FIG. 7E is an electric circuit diagram showing an assembly 700E using still another combination of two modular analog signal multiplexers, according to some embodiments of the present disclosure. In particular, the assembly 700E illustrates two multiplexers 400B-1 and 400B-2, each of which is a different instance of the multiplexer 400B shown in FIG. 4B but where the multiplexer 400B-1 is included within a first instance 500C-1 of the assembly 500C as shown in FIG. 5C and the multiplexer 400B-2 is included within a first instance 500C-2 of the assembly 500C as shown in FIG. 5C, where the different reference numerals used in FIG. 4B and FIG. 5C are not used in FIG. 7E in order to not clutter the drawing. The assembly 700E may be seen as a combination of the embodiment shown in FIG. 5C and the embodiment shown in FIG. 7A and the combination of the descriptions provided with reference to these drawings is applicable to the assembly 700E shown in FIG. 7E. Descriptions as to how to operate any of the multiplexers 400B in the first or the second mode are applicable to the multiplexers 400B-1 and 400-2 of the assembly 700E and, therefore, in the interests of brevity, are not repeated.

Based on the foregoing descriptions, still further combinations of various embodiments of the analog signal multiplexers described herein are possible and are within the scope of the present disclosure.

To summarize, an output stage that is suitable for high bandwidth signal transmission across standard printed circuit boards (PCBs), facilitating easy construction of high-speed LIDAR receivers, is disclosed. Multiple instances of the proposed output stages can be for example combined to construct N:1 multiplexers without additional components in the signal-path while maintaining low noise and high bandwidth. The proposed modular analog signal multiplexers provide a simple way to extend the number of channels in a system. If the instances of multiplexers are included in separate integrated circuits (ICs), multiple instances may be combined on a circuit board to build a multiplexer with higher channel count. In other embodiments, multiple instances of multiplexers may be included in a single IC.

Example Systems

Modular analog signal multiplexers as described herein may be used in any kind of system. One example of such a system is shown in FIG. 8, providing a block diagram of an example laser range finding, e.g., LIDAR, system 800 that may include one or more of modular analog signal multiplexers for differential signals as described herein, according to some embodiments of the present disclosure. As shown in FIG. 8, system 800 may include a transmitter signal chain 810, a receiver signal chain 830, a processor 850, and a controller 860. In some instances, the receiver signal chain 830 can be implemented separately from the transmitter signal chain 810. As shown in FIG. 8, the transmitter signal chain 810 may include a digital-to-analog converter (DAC) 812, a low pass filter (LPF) 814, a programmable gain amplifier (PGA) 816, a laser driver 818, and a laser 820. The receiver chain 830 may include an optical sensor, e.g., a photodiode (PD) 832, a transimpedance amplifier (TIA) 834, an LPF 836, an analog-to-digital converter (ADC) driver 838, and an ADC 840. In some instances, a receiver chain can include a PGA coupled between the TIA 834 and the LPF 836. Such a PGA could be implemented in place of or in addition to the ADC driver 838.

The processor 850 may be configured to generate a digital signal indicating that a laser pulse is to be emitted by the laser 820. The digital signal from the processor 850 may then be converted to an analog signal by the DAC 812, further processed by the optional LPF 814, amplified by the PGA 816, and provided to the laser driver 818. In some embodiments, the laser 820 may be a laser diode, e.g., an inductive resonant laser diode.

The light emitted by the laser 820 can reach an object or a target and reflected light can be received by the optical sensor 832 of the receiver signal chain 830. Thus, the reflected light can be detected at the optical sensor 832. The optical sensor 832 can be an avalanche photodiode (APD), for example. The optical sensor 832 can generate a current pulse indicative of the received reflected light and the current pulse may be converted to a voltage pulse by the TIA 834 and, optionally, further processed by the LPF 836. The LPF 836 can be a tunable filter in certain embodiments. As illustrated, the LPF 836 may be coupled in a signal path between the TIA 834 and the ADC driver 838. In some other implementations, the LPF 836 can be coupled in a signal path between the ADC driver 838 and the ADC 840. The ADC driver 838 can generate a drive signal, based on the output of the TIA 834, to drive the ADC 840. The ADC 840 can convert the received drive signal to a digital signal, to further be processed by the processor 850. Although not specifically shown in FIG. 8, the ADC 840 may be shared among multiple receiver chains having the PD 832 and the TIA 834, where any embodiment of the modular analog signal multiplexers as described herein may be used to perform signal multiplexing to receive input signals indicative of outputs of multiple TIAs and provide an output signal that will later be a basis for an input signal to the ADC 840.

In some embodiments, the processor 850 can be a hardware processor. In some embodiments, the processor 850 can be a baseband digital signal processor. In some embodiments, the processor 850 can determine a distance between an object and the laser range finding system 800. In some embodiments, the processor 850 can output a signal indicative of the determined distance. In some embodiments, the processor 850 can identify an object from which the pulse of light reflected from the object based at least partly on the width of a pulse generated by the TIA 834. In some embodiments, the processor 850 can output data identifying the object. In some embodiments, one instance of the processor 850 may be associated with the receiver signal chain 830 and another instance of the processor 850 may be associated with the transmitter signal chain 810.

The controller 860 may be used to control aspects of the system 800, and, in particular, aspects of the present disclosure related to implementing modular analog signal multiplexers as described herein. For example, the controller 860 may generate control signals that control operation of various elements of the analog signal multiplexers and assemblies of such multiplexers as described herein. In some embodiments, the controller 860 may be implemented as a data processing system shown in FIG. 9.

Figure 9:
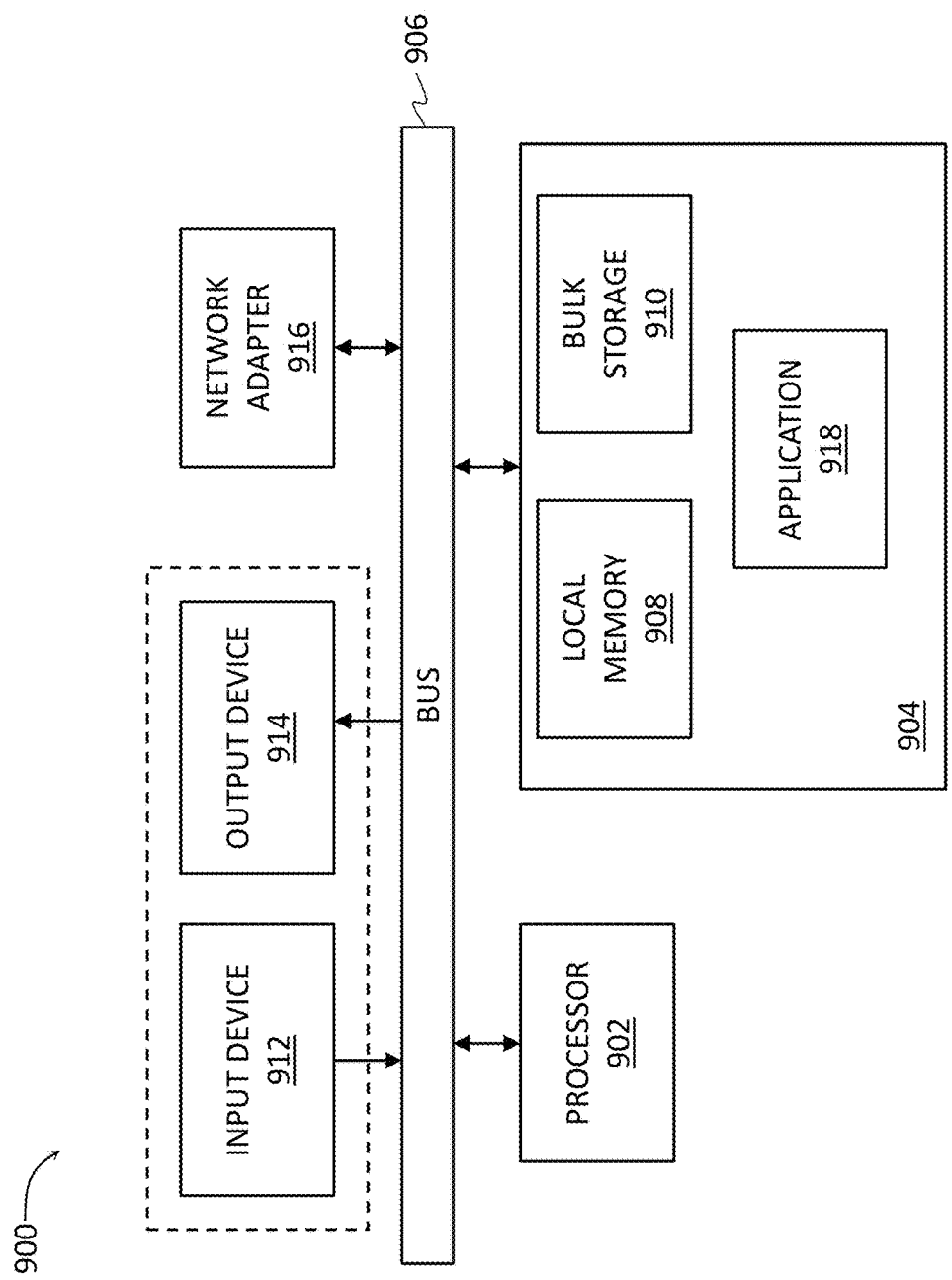
FIG. 9 provides a block diagram illustrating an example data processing system that may be configured to implement, or control, at least portions of any of the modular analog signal multiplexers described herein, according to some embodiments of the present disclosure.

FIG. 9 provides a block diagram illustrating an example data processing system 900 that may be configured to implement, or control, at least portions of implementing any embodiments of modular analog signal multiplexers as described herein, according to some embodiments of the present disclosure. For example, in some embodiments, the controller 860 may be implemented as the data processing system 900.

As shown in FIG. 9, the data processing system 900 may include at least one processor 902, e.g. a hardware processor 902, coupled to memory elements 904 through a system bus 906. As such, the data processing system may store program code within memory elements 904. Further, the processor 902 may execute the program code accessed from the memory elements 904 via a system bus 906. In one aspect, the data processing system may be implemented as a computer that is suitable for storing and/or executing program code. It should be appreciated, however, that the data processing system 900 may be implemented in the form of any system including a processor and a memory that is capable of performing the functions described within this disclosure.

In some embodiments, the processor 902 can execute software or an algorithm to perform the activities as discussed in this specification, in particular activities related to modular analog signal multiplexers as described herein. The processor 902 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 902 may be communicatively coupled to the memory element 904, for example in a direct-memory access (DMA) configuration, so that the processor 902 may read from or write to the memory elements 904.

In general, the memory elements 904 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 900 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components of the modular analog signal multiplexers as described herein, can also include suitable interfaces for receiving, transmitting, and/or otherwise communicating data or information in a network environment so that they can communicate with, e.g., the data processing system 900 of another one of these elements.

In certain example implementations, mechanisms related to modular analog signal multiplexers as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 904 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 902 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 904 may include one or more physical memory devices such as, for example, local memory 908 and one or more bulk storage devices 910. The local memory may refer to RAM or other non-persistent memory device(s) generally used during actual execution of the program code. A bulk storage device may be implemented as a hard drive or other persistent data storage device. The processing system 900 may also include one or more cache memories (not shown) that provide temporary storage of at least some program code in order to reduce the number of times program code must be retrieved from the bulk storage device 910 during execution.

As shown in FIG. 9, the memory elements 904 may store an application 918. In various embodiments, the application 918 may be stored in the local memory 908, the one or more bulk storage devices 910, or apart from the local memory and the bulk storage devices. It should be appreciated that the data processing system 900 may further execute an operating system (not shown in FIG. 9) that can facilitate execution of the application 918. The application 918, being implemented in the form of executable program code, can be executed by the data processing system 900, e.g., by the processor 902. Responsive to executing the application, the data processing system 900 may be configured to perform one or more operations or method steps described herein.

Input/output (I/O) devices depicted as an input device 912 and an output device 914, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 914 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 914. Input and/or output devices 912, 914 may be coupled to the data processing system either directly or through intervening I/O controllers.

In an embodiment, the input and the output devices may be implemented as a combined input/output device (illustrated in FIG. 9 with a dashed line surrounding the input device 912 and the output device 914). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 916 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 900, and a data transmitter for transmitting data from the data processing system 900 to said systems, devices and/or networks. Modems, cable modems, and Ethernet cards are examples of different types of network adapter that may be used with the data processing system 900.

Figure 10:
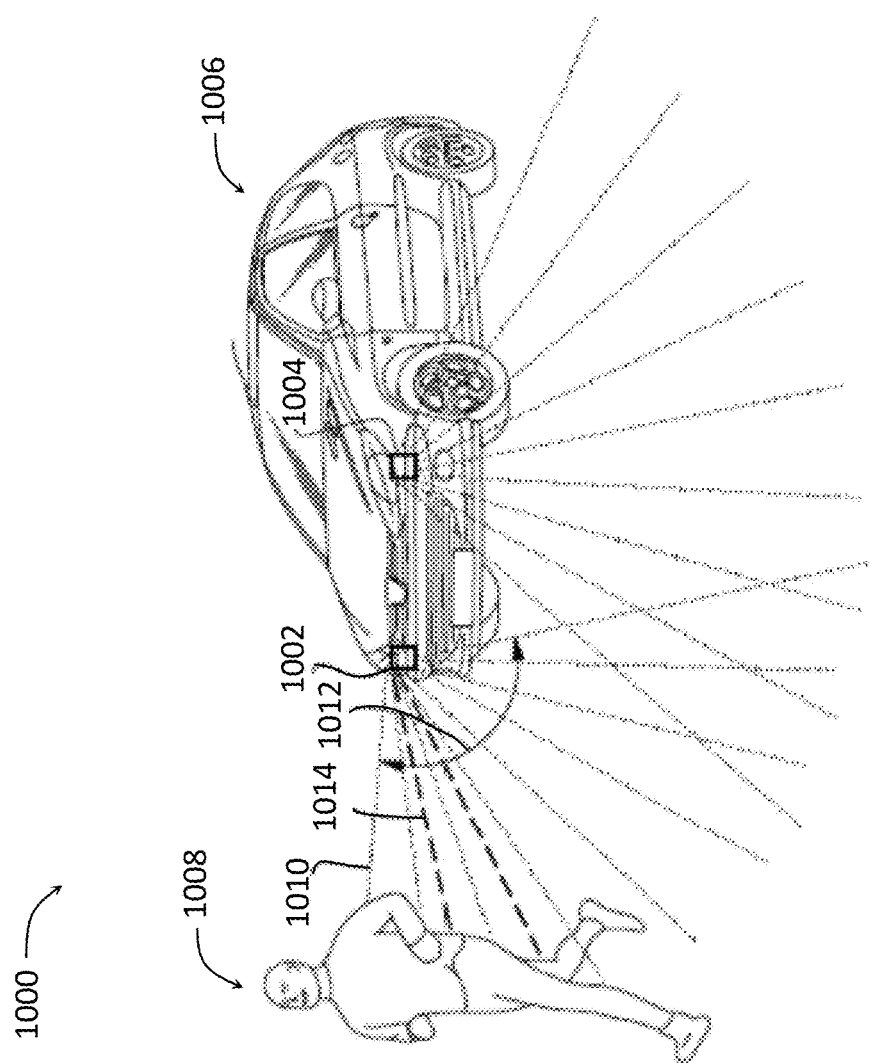
FIG. 10 is an illustration of a LIDAR system integrated with an automobile, according to some embodiments of the present disclosure.

FIG. 10 provides an illustration 1000 of a LIDAR system integrated with an automobile, according to some embodiments of the present disclosure. This is an example application in which any of the modular analog signal multiplexers as described herein can be implemented. FIG. 10 illustrates two LIDAR systems 1002 and 1004 integrated with an automobile 1006. The first LIDAR system 1002 may be positioned near a right headlight of the automobile 1006 and the second LIDAR system 1004 may be positioned near the left headlight of automobile 1006. The LIDAR systems 1002 and/or 1004 can implement any suitable principles of modular analog signal multiplexers, as discussed herein. In some embodiments, any of the LIDAR systems 1002 and/or 1004 may include the ADC 840 that is shared among multiple receiver chains with the PD 832 and the TIA 834, where any of the modular analog signal multiplexers described herein may be used to perform signal multiplexing to receive input signals indicative of outputs of multiple TIAs and provide an output signal that will later be a basis for an input signal to the ADC 840. In other embodiments, each of the LIDAR systems 1002 and/or 1004 may include the LIDAR receiver chain 830 as shown in FIG. 8, where the ADC 840 of the LIDAR systems 1002 and/or 1004 may be shared among these systems using any of the modular analog signal multiplexers described herein. The LIDAR systems 1002 and/or 1004 can detect a distance between the automobile 1006 and an object 1008.

As illustrated, a transmitter of the LIDAR system 1002 can transmit pulses of light 1010 at an angle 1012. At least some of the pulses of light 1010 may be generated by a laser diode, e.g., the laser diode 820, shown in FIG. 8. The transmitted light 1010 can travel through the air and reach the object 1008. The object 1008 can reflect back pulses of light 1014 to a receiver of the LIDAR system 1002. Embodiments discussed herein can generate information to identify the object 1008. The pulses of light 1010 can be transmitted three dimensionally to obtain three dimensional information of the surroundings.

One or more additional LIDAR systems can be integrated with the automobile 1006 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 1012 can be adjusted and the angle 1012 can be in any suitable range.

The illustrations of FIGS. 8 and 10 provide just some non-limiting example where modular analog signal multiplexers described herein as described herein may be used. In other embodiments, any of the modular analog signal multiplexers described herein may be implemented in a system other than a LIDAR system as shown in FIGS. 8 and 10. Various teachings related to modular analog signal multiplexers as described herein are applicable to a large variety of other systems. In some scenarios, various embodiments of modular analog signal multiplexers as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of modular analog signal multiplexers as described herein can be used in the industrial markets that include process control systems that help drive productivity, energy efficiency, and reliability. In yet further scenarios, various embodiments of modular analog signal multiplexers may be used in consumer applications.

SELECT EXAMPLES

The following paragraphs provide examples of various ones of the embodiments disclosed herein.

Example A1 provides an analog signal multiplexer that includes an additional differential output having terminals TERM+ and TERM−.

Example A2 provides an output stage comprising an analog signal multiplexer comprising an additional differential output having terminals TERM+ and TERM−.

Example A3 provides the output stage according to example A2, wherein the output stage includes coupling between components as shown in FIG. 4A.

Example A4 provides the output stage according to example A2, wherein the output stage includes coupling between components as shown in FIG. 5A.

Example A5 provides the output stage according to example A2, wherein the output stage includes coupling between components as shown in FIG. 7A.

Example A6 provides the output stage according to example A2, wherein the output stage includes coupling between components as shown in any one of FIGS. 4-6 but with differential pairs replaced with differential current mirrors.

Example A7 provides an electronic component comprising an analog signal multiplexer and/or an output stage according to any one of the preceding examples.

Example A8 provides the electronic component according to example A7, wherein the electronic component is a TIA or an ADC driver.

Example A9 provides the electronic component according to example A7, wherein the electronic component is a LIDAR receiver.

Example B1 provides a signal multiplexer arrangement, including a first signal multiplexer, including a load and an output stage, where an input of the output stage of the first signal multiplexer is coupled to a first input of the signal multiplexer arrangement, and where an output of the output stage of the first signal multiplexer is coupled to an output of the first signal multiplexer; and a second signal multiplexer, including a load and an output stage, where an input of the output stage of the second signal multiplexer is coupled to a first input of the signal multiplexer arrangement, and where an output of the output stage of the second signal multiplexer is coupled to an output of the second signal multiplexer. The output of the first signal multiplexer is coupled to the output of the second signal multiplexer, the load is of the first signal multiplexer is coupled to the output of the first signal multiplexer (and, therefore, is also coupled to the output of the second signal multiplexer), and the load of the second signal multiplexer is de-coupled from the output of the first signal multiplexer and from the output of the second signal multiplexer. In such an example, the output stages of the first and second signal multiplexers are coupled to the load of the first signal multiplexer.

Example B2 provides the signal multiplexer arrangement according to example B1, where the load of the second signal multiplexer is electrically floating (i.e., not coupled to any potential).

Example B3 provides the signal multiplexer arrangement according to examples B1 or B2, where the output stage of the first signal multiplexer is a first output stage, the output stage of the second signal multiplexer is a second output stage, the first signal multiplexer further includes a third output stage, where an input of the third output stage is coupled to a third input of the signal multiplexer arrangement, and where an output of the third output stage is coupled to the output of the first signal multiplexer, and the second signal multiplexer further includes a fourth output stage, where an input of the fourth output stage is coupled to a fourth input of the signal multiplexer arrangement, and where an output of the fourth output stage is coupled to the output of the second signal multiplexer. In such an example, all four output stages of the first and second signal multiplexers are coupled to the load of the first signal multiplexer.

Example B4 provides the signal multiplexer arrangement according to example B3, where each output stage of the first, second, third, and fourth output stages is configured to provide at the output of the output stage an output signal indicative of an input signal received at the input of the output stage when a bias signal is provided to the output stage.

Example B5 provides the signal multiplexer arrangement according to any one of examples B1-B4, where at least one of the output stages includes a differential pair.

Example B6 provides the signal multiplexer arrangement according to any one of examples B1-B4, where at least one of the output stages includes a differential current mirror.

Example B7 provides a signal multiplexer arrangement, including: a first signal multiplexer, including a load and an output stage, where an input of the output stage of the first signal multiplexer is coupled to a first input of the signal multiplexer arrangement, and where an output of the output stage of the first signal multiplexer is coupled to an output of the first signal multiplexer; a second signal multiplexer, including a load and an output stage, where an input of the output stage of the second signal multiplexer is coupled to a first input of the signal multiplexer arrangement, where an output of the output stage of the second signal multiplexer is coupled to an output of the second signal multiplexer, and where the output of the first signal multiplexer is coupled to the output of the second signal multiplexer; and a switch arrangement that included one or more switches, configured to either couple or de-couple the load of the first signal multiplexer and the output of the first signal multiplexer. In such an example, the output stages of the first and second signal multiplexers are coupled to the load of the first signal multiplexer when the switch arrangement couples the load of the first signal multiplexer and the output of the first signal multiplexer.

Example B8 provides the signal multiplexer arrangement according to example B7, where the switch arrangement is a first switch arrangement, and the signal multiplexer arrangement further includes a second switch arrangement that included one or more switches, configured to either couple or de-couple the load of the second signal multiplexer and the output of the second signal multiplexer. In such an example, the output stages of the first and second signal multiplexers are coupled to the load of the first signal multiplexer when either the first switch arrangement couples the load of the first signal multiplexer and the output of the first signal multiplexer or the second switch arrangement couples the load of the second signal multiplexer and the output of the second signal multiplexer.

Example B9 provides the signal multiplexer arrangement according to example B8, where the first and second switch arrangements are configured so that: when the first switch arrangement couples the load of the first signal multiplexer and the output of the first signal multiplexer the second switch arrangement de-couples the load of the second signal multiplexer and the output of the second signal multiplexer, and when the second switch arrangement couples the load of the second signal multiplexer and the output of the second signal multiplexer the first switch arrangement de-couples the load of the first signal multiplexer and the output of the first signal multiplexer.

Example B10 provides the signal multiplexer arrangement according to any one of examples B7-B9, where when the first switch arrangement couples the load of the first signal multiplexer and the output of the first signal multiplexer the load of the second signal multiplexer is electrically floating (i.e., not coupled to any potential).

Example B11 provides a signal multiplexer, including a load and an output stage, having an input coupled to an input of the signal multiplexer, and having an output coupled to an output of the signal multiplexer, where at different times, the signal multiplexer is configured to operate either in a first mode or in a second mode, in the first mode, the load is coupled to the output of the signal multiplexer, and in the second mode, the load is not coupled to the output of the signal multiplexer.

Example B12 provides the signal multiplexer according to example B11, where the output stage is a first output stage, the input of the signal multiplexer is a first input of the signal multiplexer, the signal multiplexer further includes a second output stage, having an input coupled to a second input of the signal multiplexer, and having an output coupled to the output of the signal multiplexer. In such an example, the first and second output stages have outputs coupled to the same output of the signal multiplexer, which output may be either coupled to the load (in the first mode) or not coupled to the load (in the second mode). Thus, in the first mode the respective outputs of the first and second output stages are coupled to the load, while in the second mode the respective outputs of the first and second output stages are de-coupled from the load.

Example B13 provides the signal multiplexer according to example B12, further including a first bias signal source, configured to provide a bias signal for the first output stage; and a second bias signal source, configured to provide a bias signal for the second output stage, where the signal multiplexer is configured to provide (output) at the output of the signal multiplexer a signal indicative of an input signal received at the first input of the signal multiplexer when the first bias signal source provides the bias signal to the first output stage, and the signal multiplexer is configured to provide (output) at the output of the signal multiplexer a signal indicative of an input signal received at the second input of the signal multiplexer when the second bias signal source provides the bias signal to the second output stage.

Example B14 provides the signal multiplexer according to example B13, where the signal multiplexer is configured to provide (output) at the output of the signal multiplexer a signal that is a combination of the signal indicative of the input signal received at the first input of the signal multiplexer and the signal indicative of the input signal received at the second input of the signal multiplexer when the first bias signal source provides the bias signal to the first output stage and the second bias signal source provides the bias signal to the second output stage.

Example B15 provides the signal multiplexer according to any one of examples B11-B14, further including a switch arrangement that included one or more switches, configured to change coupling between the load and the output of the signal multiplexer to place the signal multiplexer either in the first mode of operation or the second mode of operation.

Example B16 provides the signal multiplexer according to any one of examples B11-B15, where the output of the signal multiplexer is a first output, and the signal multiplexer further includes a second output, separate from the first output, where the load is coupled to the second output; and a resistor arrangement that included one or more resistive elements, configured to change coupling between the load and the output of the signal multiplexer to place the signal multiplexer either in the first mode of operation or the second mode of operation, where in the first mode, the resistor arrangement couples the second output and the first output (thus coupling the load and the first output of the signal multiplexer), and in the second mode, the resistor arrangement de-couples the second output and the first output (thus de-coupling the load and the first output of the signal multiplexer), Example B17 provides the signal multiplexer according to any one of examples B11-B16, where the input of the output stage is a differential input, each of the output of the output stage and the output of the signal multiplexer is a differential output, and in the first mode, the load is coupled to the output of the signal multiplexer via a differential connection.

Example B18 provides the signal multiplexer according to example B17, where the input of the signal multiplexer is a differential input.

Example B19 provides the signal multiplexer according to example B17, where the input of the signal multiplexer is a single-ended input, and the signal multiplexer further includes a single-ended to differential converter configured to convert a signal provided to the signal multiplexer over the single-ended input of the signal multiplexer to a differential signal to be provided to the input of the output stage.

Example B20 provides the signal multiplexer according to any one of examples B11-B19, where the output stage includes a differential pair or a differential current mirror.

Example B21 provides an electronic component comprising a signal multiplexer, an output stage, or a signal multiplexer arrangement according to any one of the preceding examples.

Example B22 provides the electronic component according to example B21, wherein the electronic component is a TIA or an ADC driver.

Example B23 provides the electronic component according to example B21, wherein the electronic component is a LIDAR receiver.

Example B24 provides a method, including steps performed by a system or a device according to any one of the preceding examples.

Example B25 provides a method, including steps that cause a system to operate according to any one of the preceding examples.

Example B26 provides a non-transitory computer-readable storage medium storing instructions which, when executed by a processor, cause the processor to perform at least portions of the methods according to any one of examples B24-B25.

Example B27 provides a computer program product including instructions which, when executed by a processor, cause the processor to perform at least portions of the methods according to any one of examples B24-B25.

Other Implementation Notes, Variations, and Applications

Principles and advantages discussed herein can be used in any device where analog signal multiplexing may need to take place. For example, aspects of this disclosure can be implemented in various range finding systems. For example, aspects of this disclosure can be implemented in any suitable LIDAR system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology. Moreover, aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

While certain embodiments have been described, these embodiments have been presented by way of example, and are not intended to limit the scope of the disclosure. For example, while some embodiments refer to an APD being coupled to an input port of a TIA, these embodiments are equally applicable to any other device that can generate current pulses to be provided to an input of a TIA, e.g., to any other type of a PD. In another example, while some embodiments may refer to a PD that sinks current from the TIA, these embodiments may be modified, in a way that would be obvious to a person of ordinary skill in the art, to a PD that sources current to the TIA, all of which embodiments being, therefore, within the scope of the present disclosure. Indeed, the novel methods, apparatus, and systems related to modular analog signal multiplexers, described herein, may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, controllers for configuring any of the components, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGS. and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended select examples. Note that all optional features of the apparatus described above may also be implemented with respect to the method or process described herein and specifics in the examples may be used anywhere in one or more embodiments.

The invention claimed is:

1. A system comprising a signal multiplexer arrangement, the signal multiplexer arrangement comprising:
a first signal multiplexer, including a load and an output stage, where an input of the output stage of the first signal multiplexer is coupled to a first input of the signal multiplexer arrangement, and where an output of the output stage of the first signal multiplexer is coupled to an output of the first signal multiplexer; and
a second signal multiplexer, including a load and an output stage, where an input of the output stage of the second signal multiplexer is coupled to a first input of the signal multiplexer arrangement, and where an output of the output stage of the second signal multiplexer is coupled to an output of the second signal multiplexer, wherein:
the output of the first signal multiplexer is coupled to the output of the second signal multiplexer,
the load of the first signal multiplexer is coupled to the output of the first signal multiplexer, and
the load of the second signal multiplexer is de-coupled from the output of the first signal multiplexer and from the output of the second signal multiplexer.

2. The system according to claim 1, wherein the load of the second signal multiplexer is electrically floating.

3. The system according to claim 1, wherein:
the output stage of the first signal multiplexer is a first output stage,
the output stage of the second signal multiplexer is a second output stage,
the first signal multiplexer further includes a third output stage, where an input of the third output stage is coupled to a third input of the signal multiplexer arrangement, and where an output of the third output stage is coupled to the output of the first signal multiplexer, and
the second signal multiplexer further includes a fourth output stage, where an input of the fourth output stage is coupled to a fourth input of the signal multiplexer arrangement, and where an output of the fourth output stage is coupled to the output of the second signal multiplexer.

4. The system according to claim 3, wherein each output stage of the first, second, third, and fourth output stages is to provide at the output of the output stage an output signal indicative of an input signal received at the input of the output stage when a bias signal is provided to the output stage.

5. The system according to claim 1, wherein at least one of the output stages includes a differential pair.

6. The system according to claim 1, wherein at least one of the output stages includes a differential current mirror.

7. A system comprising a signal multiplexer arrangement, the signal multiplexer arrangement comprising:
a first signal multiplexer, including a load and an output stage, where an input of the output stage of the first signal multiplexer is coupled to a first input of the signal multiplexer arrangement, and where an output of the output stage of the first signal multiplexer is coupled to an output of the first signal multiplexer;
a second signal multiplexer, including a load and an output stage, where an input of the output stage of the second signal multiplexer is coupled to a first input of the signal multiplexer arrangement, where an output of the output stage of the second signal multiplexer is coupled to an output of the second signal multiplexer, and where the output of the first signal multiplexer is coupled to the output of the second signal multiplexer; and
a switch arrangement, to couple and de-couple the load of the first signal multiplexer and the output of the first signal multiplexer.

8. The system according to claim 7, wherein:
the switch arrangement is a first switch arrangement, and
the signal multiplexer arrangement further includes a second switch arrangement, to either couple or de-couple the load of the second signal multiplexer and the output of the second signal multiplexer.

9. The system according to claim 8, wherein the first and second switch arrangements are configured so that:
when the first switch arrangement couples the load of the first signal multiplexer and the output of the first signal multiplexer the second switch arrangement de-couples the load of the second signal multiplexer and the output of the second signal multiplexer, and
when the second switch arrangement couples the load of the second signal multiplexer and the output of the second signal multiplexer the first switch arrangement de-couples the load of the first signal multiplexer and the output of the first signal multiplexer.

10. The system according to claim 7, wherein when the first switch arrangement couples the load of the first signal multiplexer and the output of the first signal multiplexer the load of the second signal multiplexer is electrically floating.

11. A signal multiplexer, comprising:
an output stage, having an input coupled to an input of the signal multiplexer, and having an output coupled to an output of the signal multiplexer; and
a load,
wherein:
the signal multiplexer is to operate either in a first mode or in a second mode,
in the first mode, the load is coupled to the output of the signal multiplexer, and
in the second mode, the load is not coupled to the output of the signal multiplexer.

12. The signal multiplexer according to claim 11, wherein:
the output stage is a first output stage,
the input of the signal multiplexer is a first input of the signal multiplexer,
the signal multiplexer further includes a second output stage, having an input coupled to a second input of the signal multiplexer, and having an output coupled to the output of the signal multiplexer.

13. The signal multiplexer according to claim 12, further comprising:
a first bias signal source, to provide a bias signal for the first output stage; and
a second bias signal source, to provide a bias signal for the second output stage,
wherein:
the signal multiplexer is to provide at the output of the signal multiplexer a signal indicative of an input signal received at the first input of the signal multiplexer when the first bias signal source provides the bias signal to the first output stage, and
the signal multiplexer is to provide at the output of the signal multiplexer a signal indicative of an input signal received at the second input of the signal multiplexer when the second bias signal source provides the bias signal to the second output stage.

14. The signal multiplexer according to claim 13, wherein:
the signal multiplexer is to provide at the output of the signal multiplexer a signal that is a combination of the signal indicative of the input signal received at the first input of the signal multiplexer and the signal indicative of the input signal received at the second input of the signal multiplexer when the first bias signal source provides the bias signal to the first output stage and the second bias signal source provides the bias signal to the second output stage.

15. The signal multiplexer according to claim 11, further comprising a switch arrangement, to change coupling between the load and the output of the signal multiplexer to place the signal multiplexer either in the first mode of operation or the second mode of operation.

16. The signal multiplexer according to claim 11, wherein the output of the signal multiplexer is a first output, and the signal multiplexer further includes:
- a second output, separate from the first output, where the load is coupled to the second output; and
- a resistor arrangement, to change coupling between the load and the output of the signal multiplexer to place the signal multiplexer either in the first mode of operation or the second mode of operation, wherein:
- in the first mode, the resistor arrangement couples the second output and the first output, and
- in the second mode, the resistor arrangement de-couples the second output and the first output.

17. The signal multiplexer according to claim 11, wherein:
- the input of the output stage is a differential input,
- each of the output of the output stage and the output of the signal multiplexer is a differential output, and
- in the first mode, the load is coupled to the output of the signal multiplexer via a differential connection.

18. The signal multiplexer according to claim 17, wherein the input of the signal multiplexer is a differential input.

19. The signal multiplexer according to claim 17, wherein the input of the signal multiplexer is a single-ended input, and the signal multiplexer further includes a single-ended to differential converter to convert a signal provided to the signal multiplexer over the single-ended input of the signal multiplexer to a differential signal to be provided to the input of the output stage.

20. The signal multiplexer according to claim 11, wherein the output stage includes a differential pair or a differential current mirror.

21. The system according to claim 1, wherein:
- the system further includes a transimpedance amplifier, and
- the signal multiplexer arrangement is coupled to an output of the transimpedance amplifier.

22. The system according to claim 21, wherein:
- the system further includes an optical sensor, and
- an output of the optical sensor is coupled to an input of the transimpedance amplifier.

23. The system according to claim 1, wherein the system is a light detection and ranging (LIDAR) system.

24. The system according to claim 7, wherein:
- the system further includes a transimpedance amplifier, and
- the signal multiplexer arrangement is coupled to an output of the transimpedance amplifier.

25. The system according to claim 24, wherein:
- the system further includes an optical sensor, and
- an output of the optical sensor is coupled to an input of the transimpedance amplifier.

26. The system according to claim 7, wherein the system is a light detection and ranging (LIDAR) system.

* * * * *